United States Patent
Lindenmeier et al.

(10) Patent No.: US 12,040,537 B2
(45) Date of Patent: Jul. 16, 2024

(54) RADIATION COUPLED ANTENNAS WITH NETWORK

(71) Applicant: FUBA Automotive Electronics GmbH, Bad Salzdetfurth (DE)

(72) Inventors: Stefan Lindenmeier, Gauting (DE); Heinz Lindenmeier, Planegg (DE)

(73) Assignee: FUBA Automotive Electronics GmbH, Bad Salzdetfurth (DE)

( * ) Notice: Subject to any disclaimer, the term of this patent is extended or adjusted under 35 U.S.C. 154(b) by 126 days.

(21) Appl. No.: 17/747,959

(22) Filed: May 18, 2022

(65) Prior Publication Data

US 2022/0384938 A1    Dec. 1, 2022

(30) Foreign Application Priority Data

May 19, 2021 (DE) .................... 10 2021 002 631.4
Feb. 17, 2022 (DE) .................... 10 2022 000 604.9

(51) Int. Cl.
| | | |
|---|---|---|
| *H01Q 1/32* | (2006.01) | |
| *H01Q 1/48* | (2006.01) | |
| *H01Q 9/18* | (2006.01) | |
| *H01Q 9/32* | (2006.01) | |

(52) U.S. Cl.
CPC ............. *H01Q 1/32* (2013.01); *H01Q 1/48* (2013.01); *H01Q 9/18* (2013.01); *H01Q 9/32* (2013.01)

(58) Field of Classification Search
CPC .. H01Q 1/32; H01Q 1/48; H01Q 1/52; H01Q 1/521; H01Q 9/18; H01Q 9/32; H03H 7/383; H04B 1/0458; H04B 1/18
See application file for complete search history.

(56) References Cited

U.S. PATENT DOCUMENTS

| | | | | |
|---|---|---|---|---|
| 3,656,167 | A * | 4/1972 | Lea ...................... | H03H 7/383 |
| | | | | 343/822 |
| 6,236,372 | B1* | 5/2001 | Lindenmeier ........ | H01Q 1/1271 |
| | | | | 343/704 |
| 6,867,739 | B2* | 3/2005 | Prassmayer .......... | H01Q 1/1278 |
| | | | | 343/704 |
| 6,911,946 | B2* | 6/2005 | Lindenmeier ........... | H01Q 9/42 |
| | | | | 343/797 |
| 11,329,732 | B1* | 5/2022 | Mazor .................... | H01L 23/552 |
| 2018/0166775 | A1* | 6/2018 | Apostolos ............... | H01Q 9/32 |

FOREIGN PATENT DOCUMENTS

EP            3734755 A1    11/2020

* cited by examiner

*Primary Examiner* — Tho G Phan
(74) *Attorney, Agent, or Firm* — Dickinson Wright PLLC

(57) ABSTRACT

This invention relates to an antenna system comprising two identical mutually radiation coupled antennas arranged symmetrically with respect to one another, said antennas having a respective antenna connection gate and a network, which is connected at the input side to the antenna connection gates and which is formed from dummy elements, and having a respective antenna path to a network connection gate, said antenna paths being identical to one another and being separately associated with an antenna.

22 Claims, 28 Drawing Sheets

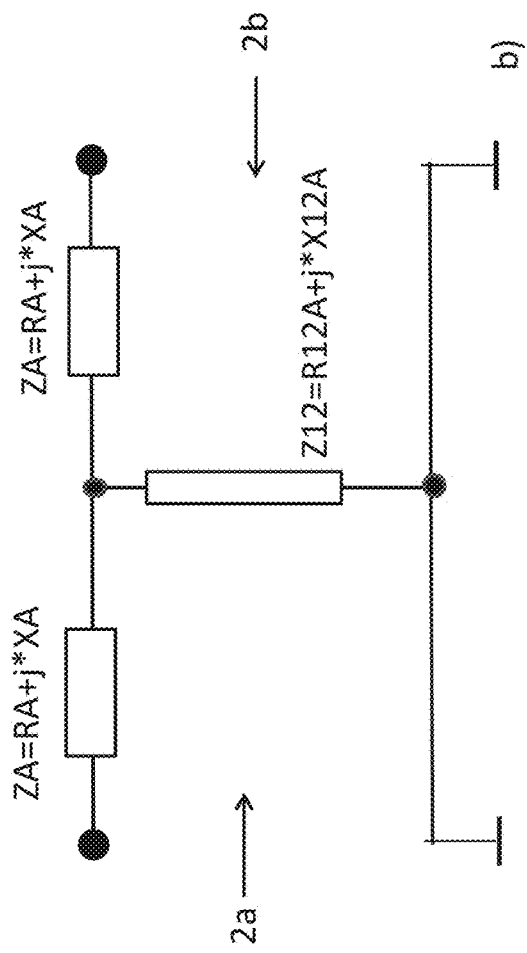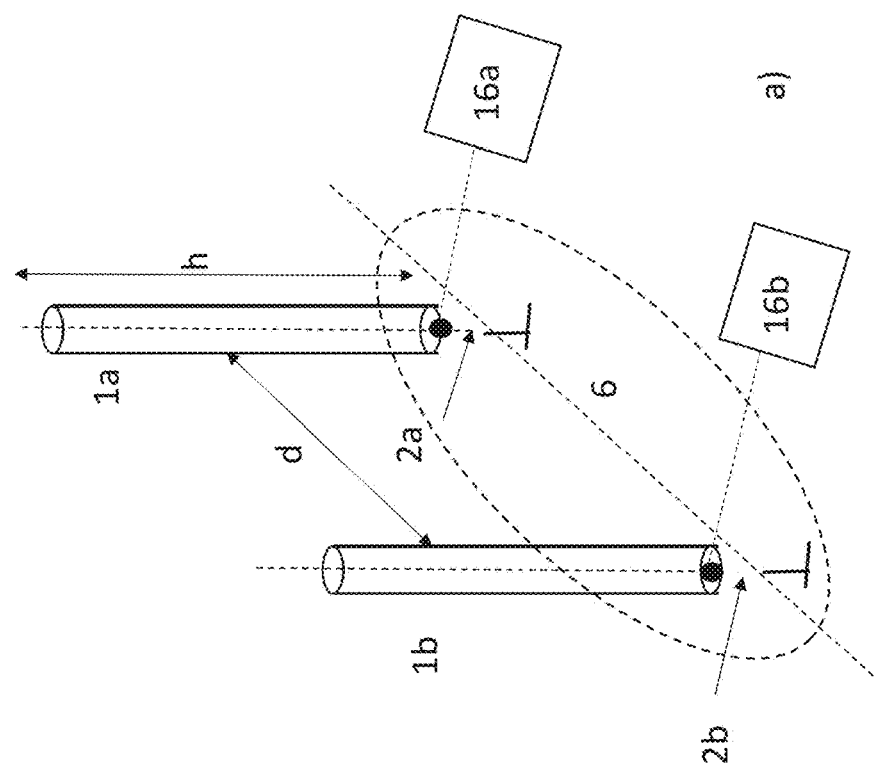
Fig. 1

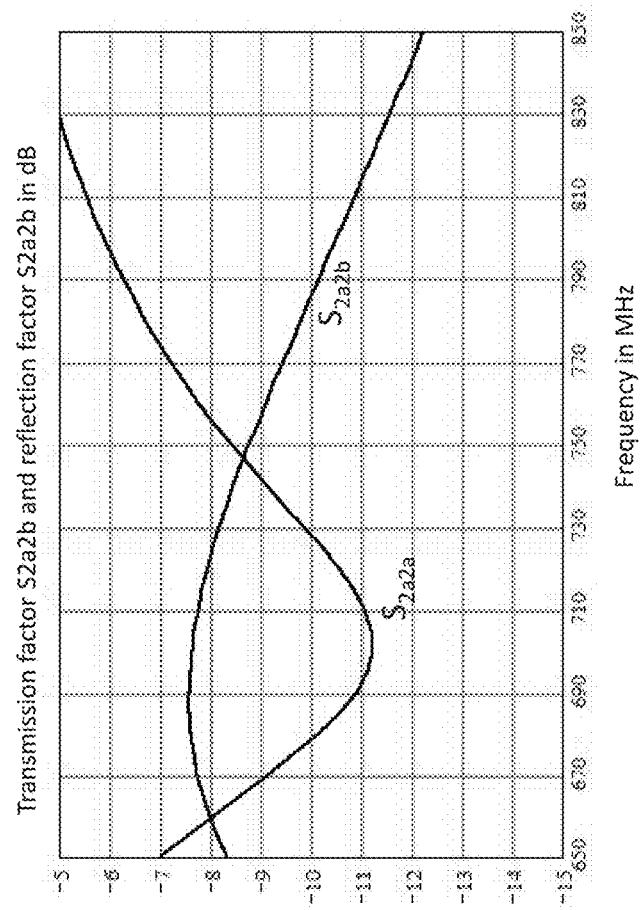
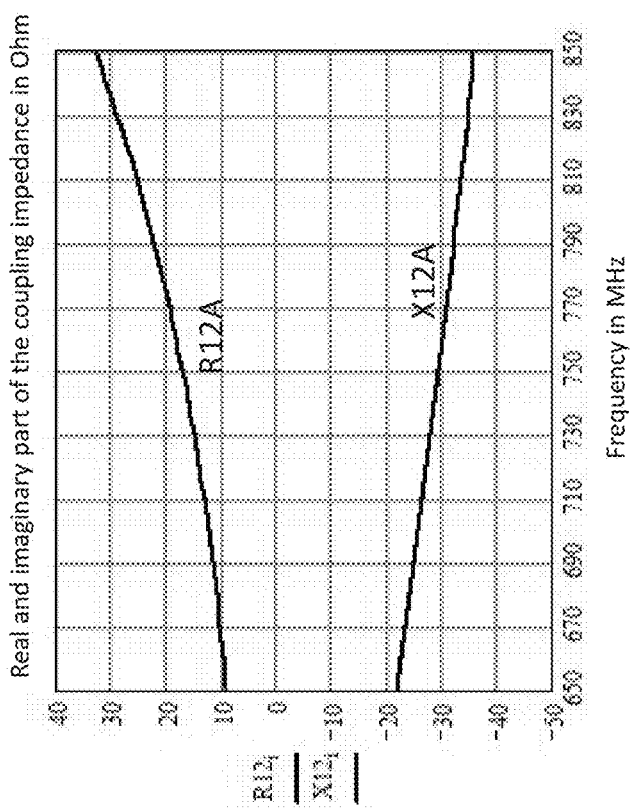
Fig. 2

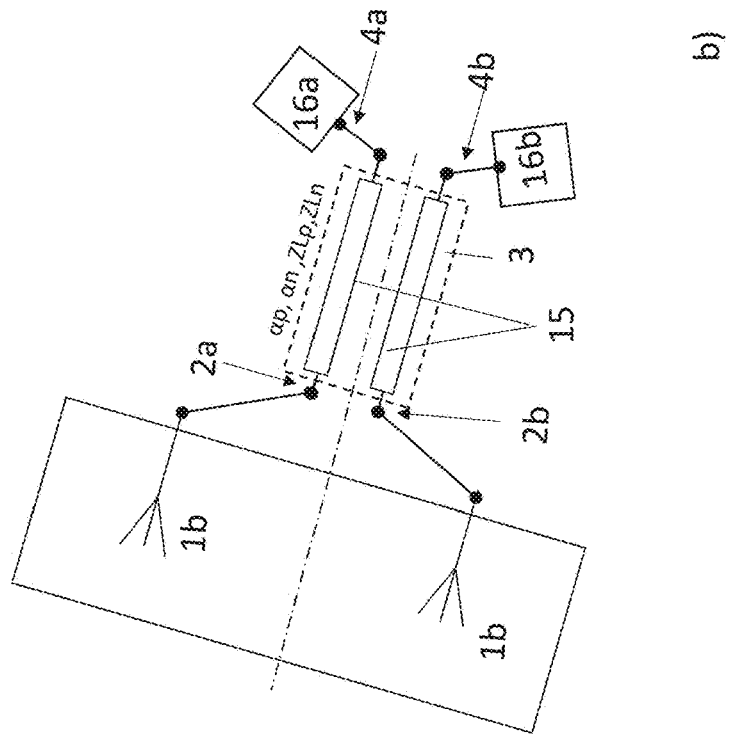
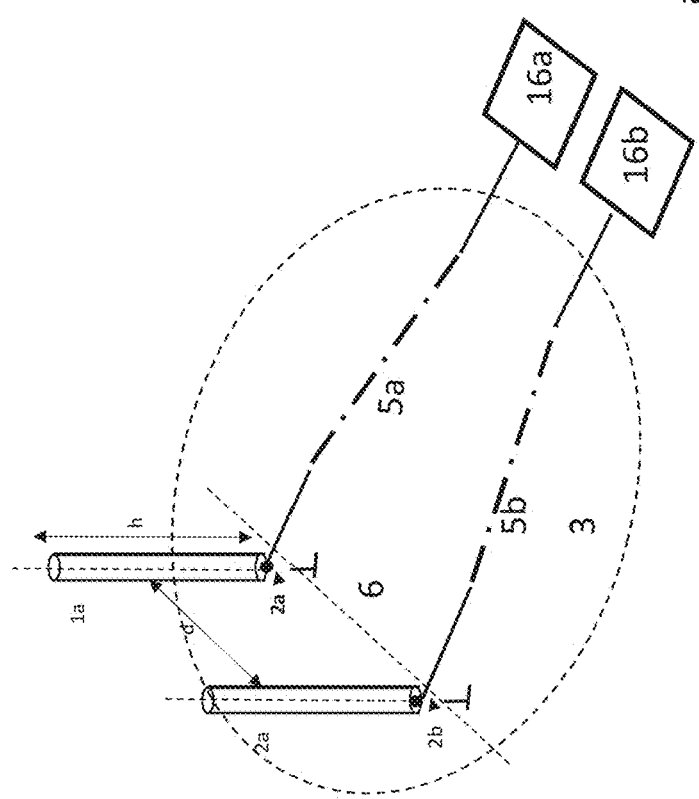
Fig. 3

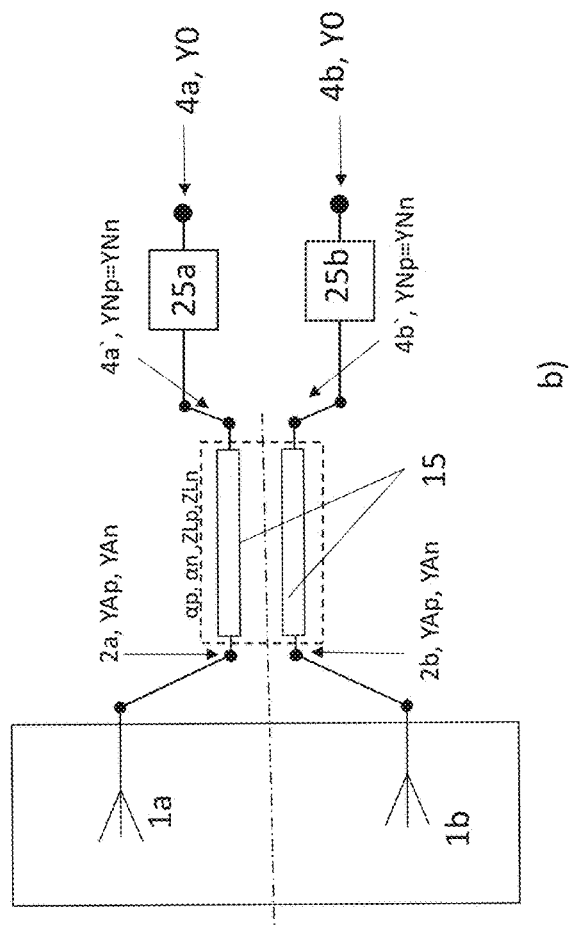
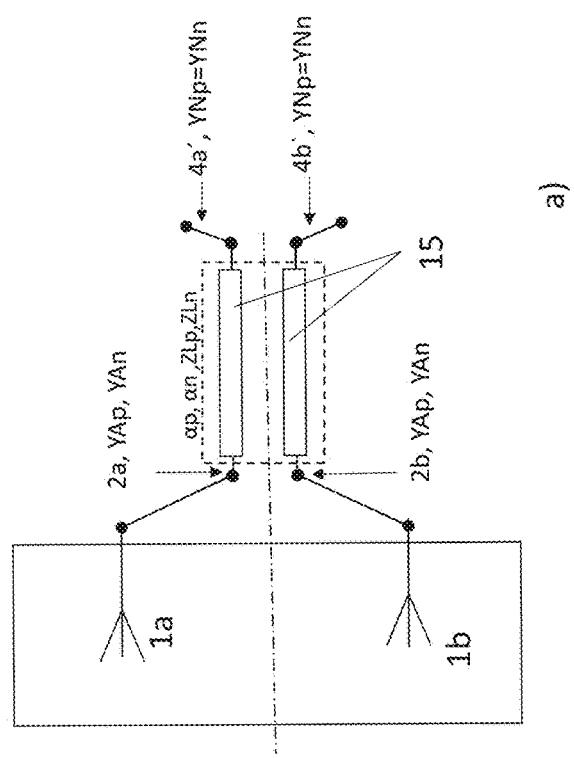
Fig. 9

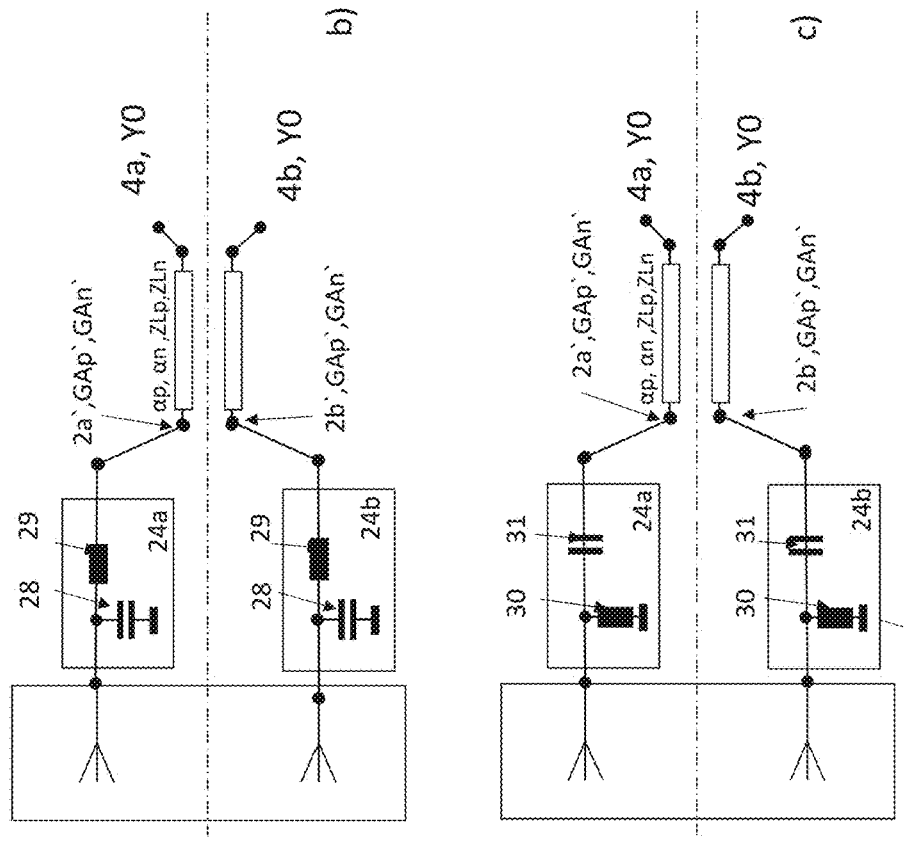
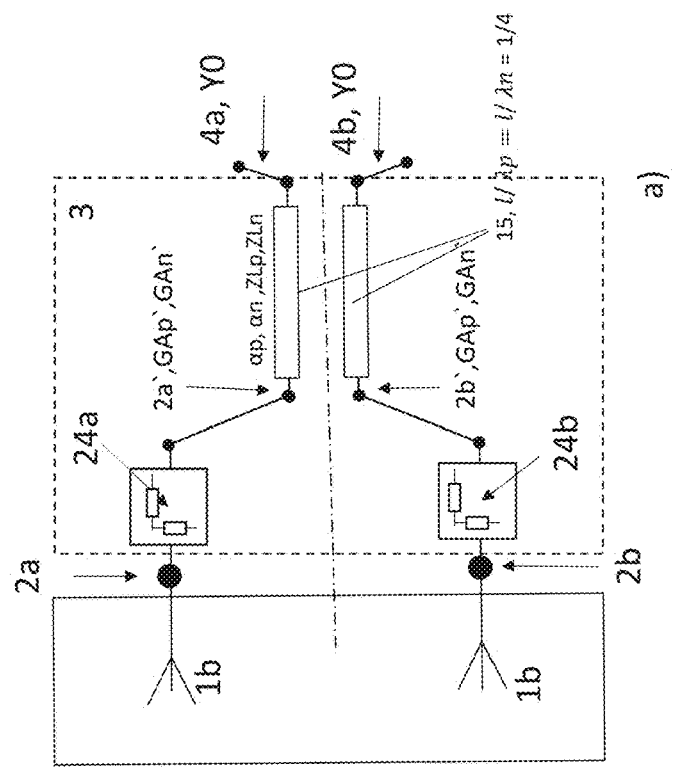
Fig. 11

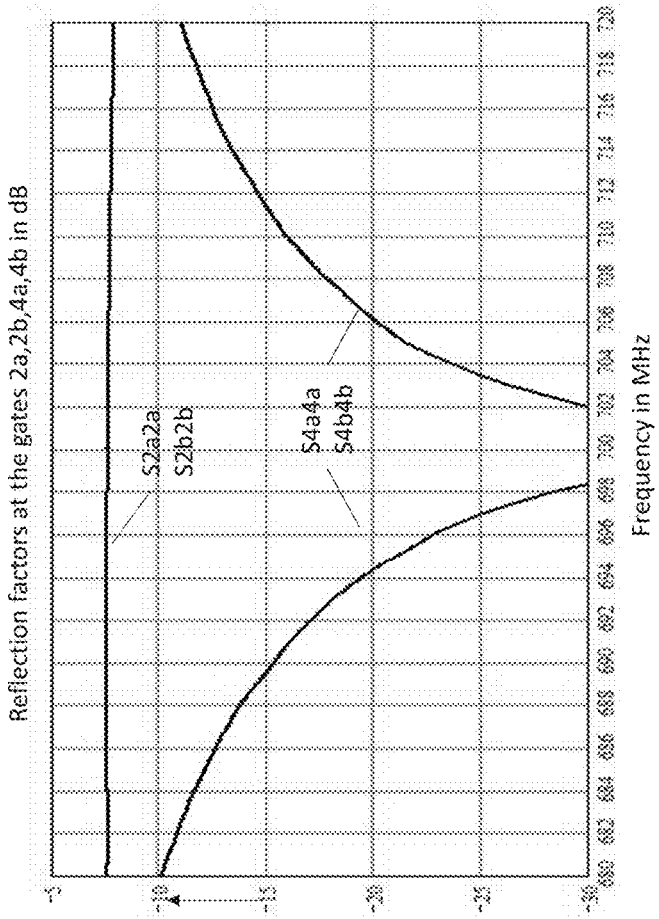
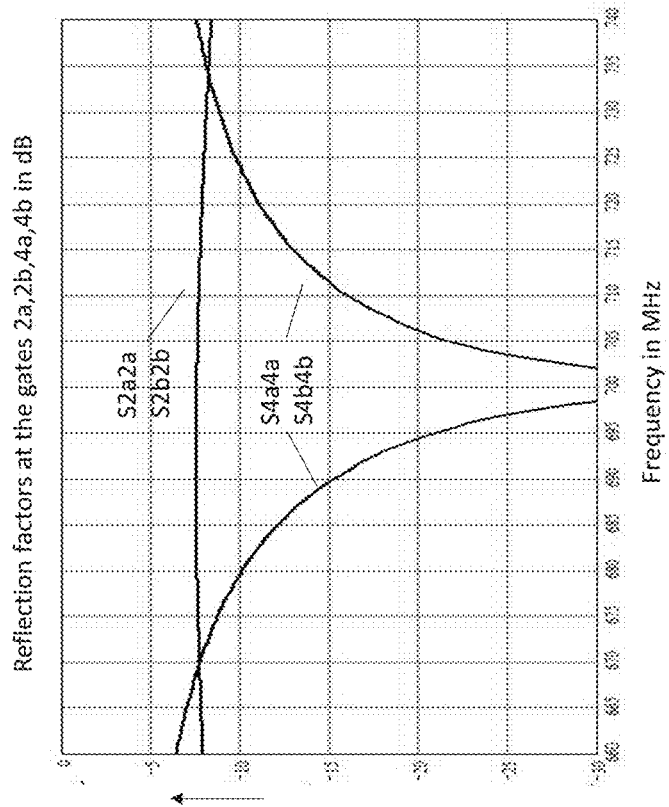
Fig. 14
Claim 8

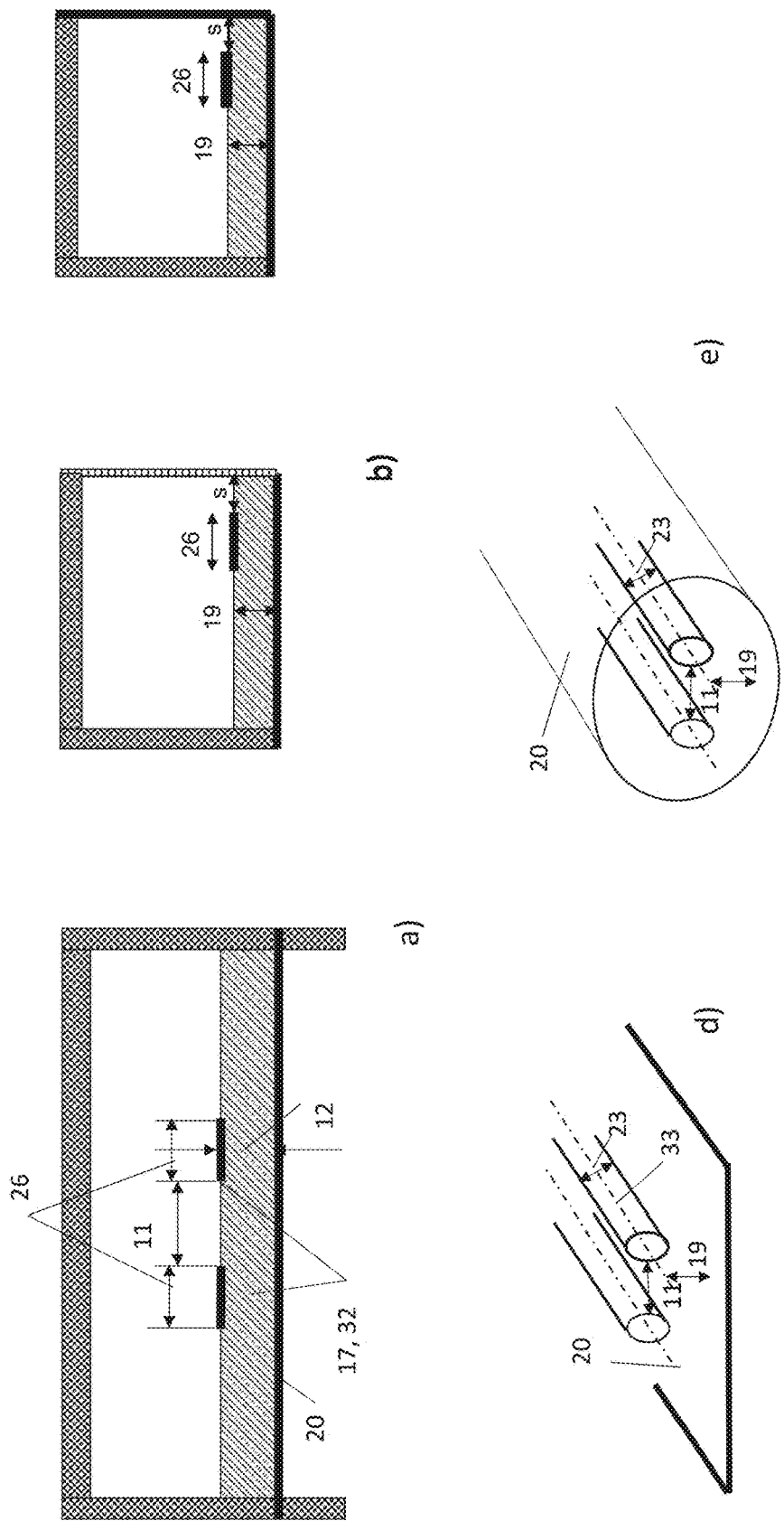

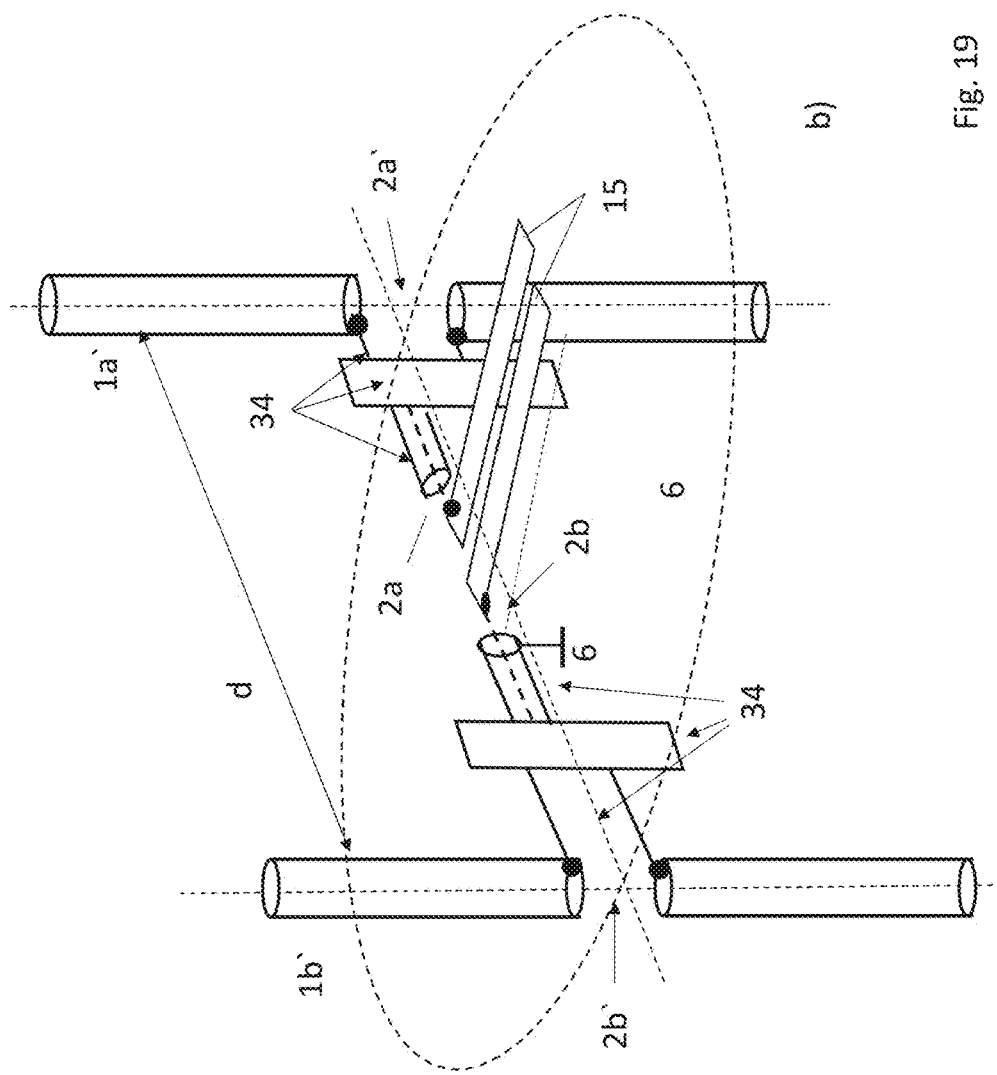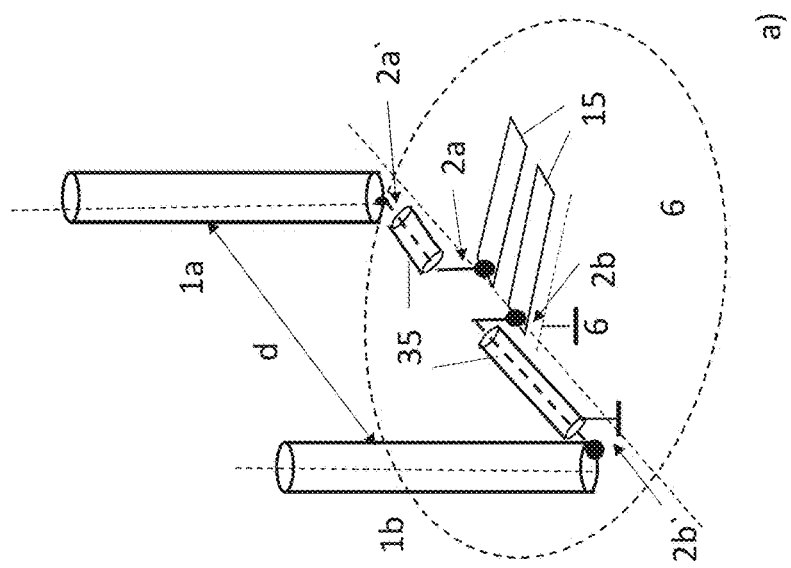
Fig. 19

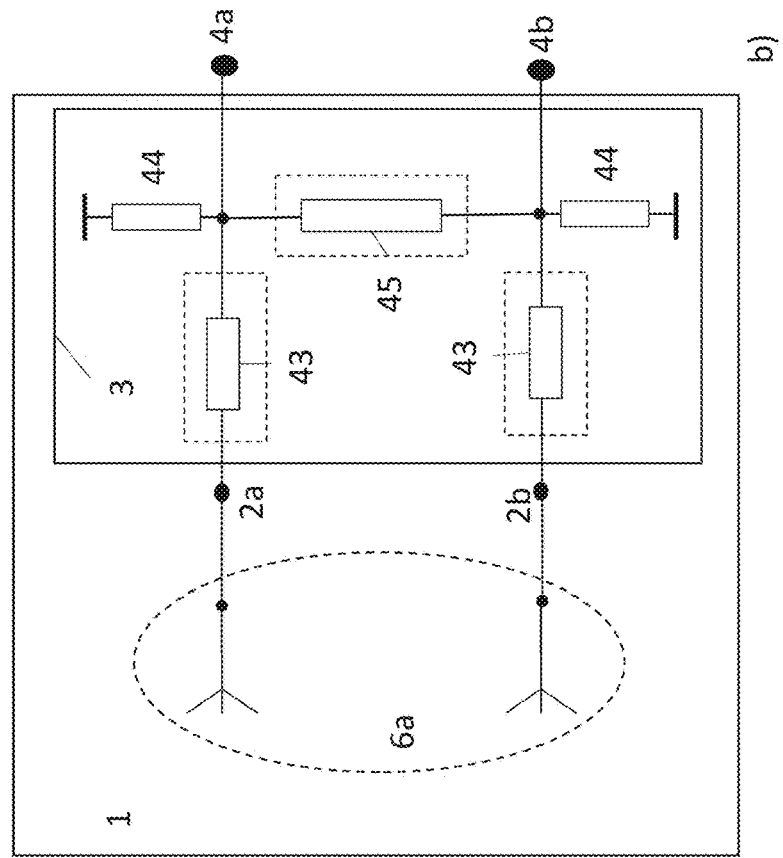
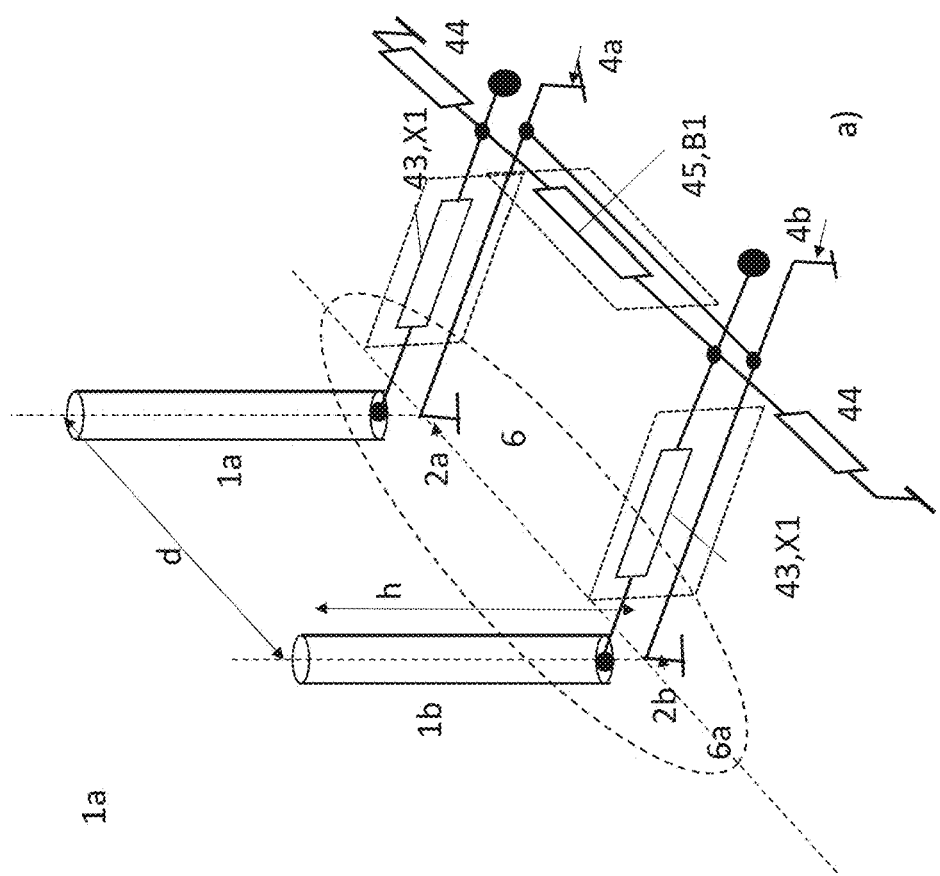
Fig. 24

RADIATION COUPLED ANTENNAS WITH NETWORK

CROSS-REFERENCES TO RELATED APPLICATIONS

This application claims the priority of German Patent Application 10 2021 002 631.4, filed on May 19, 2021, and German Patent Application 10 2022 000 604.9, filed Feb. 17, 2022, each of which is incorporated herein by reference, in their entirety.

SUMMARY

The invention relates to an antenna system 1 comprising two identical mutually radiation coupled antennas 1a, 1b arranged symmetrically with respect to one another, said antennas 1a, 1b having a respective antenna connection gate 2a, 2b and a network 3, which is connected at the input side to the antenna connection gates 2a, 2b and which is formed from dummy elements, and having a respective antenna path 15a, 15b to a network connection gate 4a, 4b, said antenna paths 15a, 15b being separately associated with an antenna 1a, 1b.

In particular for the use of antennas on vehicles, the surface requirement on the vehicle surface, the construction height, the aerodynamic shape and the resistance value of the antennas are of importance. Due to the large volumes customary in automotive construction, the economy of the manufacture of such an antenna is of special importance, however.

The large number of modern mobile communications networks, such as those designed or still under development in accordance with the LTE Long Term Evolution mobile communications standard, often requires a plurality of antennas that are identical to one another and that have to be arranged at a small spacing from one another due to the small space availability due to a technical vehicle aspect. For the LTE mobile communications standard, a frequency range between 698 and 960 MHz is provided, for example. For the design of a pair of identical LTE group antennas, they can—as shown in EP 3 734 755 A1—be very advantageously mechanically and electrically connected, for example, to a network on a circuit board and in each case connected to the connections of separate transmission-reception devices via antenna paths separately designed on a circuit board.

In the case of antennas arranged very densely packed and at a spacing of a fraction of the electric wavelength λ0 in a free space, for example antennas arranged vertically and in parallel with one another, the problem of interference in a transmission-reception device set to reception by the strong transmission signal of the other transmission-reception device arises due to the electromagnetic coupling of the two antennas. In a digital signal transmission, the bit error rate is hereby in particular sensitively raised on the reception.

Naturally, the use of the antennas and antenna arrangements presented in the present document is in no way limited to the LTE system mentioned here as an example. Furthermore, these antennas and network arrangements can particularly advantageously be used in all the communication systems in which antenna systems are used in the described frequency ranges, for example in the communication systems such as 5G, WLAN and vehicle-to-vehicle communication (Car2Car), e.g. in accordance with the IEEE802.11p standard, etc. For these applications, antennas are required that, in addition to the electrical function, are suitable for vehicles due to their compactness and their stylistic properties, with the economy of the manufacture being of special importance.

It is therefore an object of the invention, in the case of radiation coupled antennas with a network in accordance with the preamble of the present invention, to provide a network 3 by which the electromagnetic radiation coupling present between the antennas is substantially reduced as the remaining coupling occurring between the two outputs of the network 3 and the antenna system having a network 3 for mobile radio services is designed in a compact manner in a simple and economically less costly manufacturing process.

This object is satisfied by the features of claim 1. Advantageous embodiments of the invention are described in the dependent claims and in the description.

An antenna system 1 comprising two identical mutually radiation coupled antennas 1a, 1b arranged symmetrically with respect to one another, said antennas 1a, 1b having a respective antenna connection gate 2a, 2b and a network 3, which is connected at the input side to the antenna connection gates 2a, 2b and which is formed from dummy elements, and having a respective antenna path 15a, 15b to a network connection gate 4a, 4b, said antenna paths 15a, 15b being identical to one another and being separately associated with an antenna 1a, 1b, said antenna system 1 comprising the following features Each antenna connection gate 2a, 2b in each case consists of a connection point 22a, 22b live to ground and a ground connection point 6 that is connected to a common ground 6 for all the connection gates 2a, 2b, 4a, 4b.

Each live connection point 22a, 22b of an antenna connection gate 2a, 2b is in each case connected to the live connection point 39a, 39b of the corresponding network connection gate 4a, 4b of an antenna path 5a, 5b by a linear electrical conductor 8a, 8b.

A ground plane 5 areally designed at a ground spacing 12 is at least present along the two linear electrical conductors 8a, 8b.

The two linear, mutually identical electrical conductors 8a, 8b are guided at least over a common length l 10 both at a conductor spacing 11 in parallel with one another and at a ground spacing 12 in parallel with the ground plane 9 so that, due to the two linear electrical conductors 8a, 8b, in each case both a symmetrical electrical line 13 related to the ground 6 is formed and, between the two linear electrical conductors 8a, 8b, an antisymmetrical electrical line 14 related to one another is formed and thus a coupled electrical line 15 is formed.

The wave impedance ZLp present on an excitation in the same sense of the coupled electrical line 15 and the electrical angle αp as well as the wave impedance ZLn present on an excitation in an opposite sense of the coupled electrical line 15 and the electrical angle αn are designed such that, at least one frequency f1, the coupling S4a4b present between the network connection gates 4a, 4b is substantially smaller, due to the use of the network 3, than the coupling $S_{2a2b}$ present between the corresponding antenna connection gates 2a, 2b.

FIG. 3b, FIG. 4

To design the cooperation with the coupled electrical line, the admittance YAp=GAp+jBAp at one of the antenna connection gates 2a, 2b, which admittance is present on the excitation of said one antenna connection gate 2a, 2b with a measurement signal and on a simultaneous excitation of the other antenna connection gate 2a, 2b with the same measurement signal polarized in the same sense, can be detected by the antenna system 1.

Likewise, the admittance YAn=GAn+jBAn at one of the antenna connection gates, which admittance is present on the excitation of said one antenna connection gate with a measurement signal and on a simultaneous excitation of the other antenna connection gate 2a, 2b with the same but oppositely polarized measurement signal, can be detected.

To design the cooperation with the antenna system 1, the electrical properties of the coupled electrical line 15, which is released at its one end from the antenna connection gates 2a, 2b and which has the geometric length l 10, can be detected and set based on the following susceptances present at the other end of the coupled electrical line 15, on the one hand, in the case of a short-circuit of both conductors with ground 6 at the one end—and these are susceptance Bkp at one of the decoupling network connection gates 4a, 4b on its excitation with a measurement signal and on a simultaneous excitation of the other network connection gate 4a, 4b with the same measurement signal polarized in the same sense, susceptance Bkn at one of the decoupling network connection gates 4a, 4b on its excitation with a measurement signal and on a simultaneous excitation of the other network connection gate 4a, 4b with the same but oppositely polarized measurement signal, and, on the other hand, the electrical properties can be detected and set based on the following susceptances that occur in an open-circuit operation of both conductors at the one end of the electrical line 15—and these are susceptance Blp at one of the network connection gates 4a, 4b with the same measurement signal polarized in the same sense susceptance Bln at one of the network connection gates 4a, 4b on its excitation with a measurement signal and on a simultaneous excitation of the other network connection gate 4a, 4b with the same but oppositely polarized measurement signal From this, the real line wave admittance YLp of the symmetrical electrical line 13 and the electrical angle αp of said symmetrical electrical line 13 as well as the real line wave admittance YLn of the antisymmetrical electrical line 14 and the electrical angles αp and αn of said antisymmetrical electrical line 14 can be separately determined and set based on the following relationships.

$$YLp = \sqrt{-Bkp \cdot Blp} \text{ and } YLn = \sqrt{-Bkn \cdot Bln}$$

$$\alpha p = \arctan(\sqrt{-Blp/Bkp}); \quad \alpha n = \arctan(\sqrt{-Bln/Bkn}) \quad (1)$$

At both network connection gates 4a, 4b, there can be an impedance matching to the real resistance Z0=1/Y0 standardized in technology at the at least one frequency f1 and there can be a decoupling in that the structure and the length l 10 of the coupled electrical line 15 are designed such that both the line wave admittance yLp=YLp/Y0, related to Y0, of the symmetrical electrical line 13 and the electrical angle αp of said symmetrical electrical line 13 and the corresponding line wave admittance yLn=YLn/Y0, related to Y0, of the antisymmetrical electrical line 14 and the electrical angle αn of said antisymmetrical electrical line 14 are formed in accordance with the following relationships, which are predefined by the admittances YAp/Y0 and YAn/Y0, related to Y0, of the antenna system 1 at the antenna connection gates 2a, 2b, wherein it applies:

$$YAp/Y0 = yAp = gAp + j \cdot bAp \text{ and } YAn/Y0 = yAn = gAn + j \cdot bAn$$

$$YAp/Y0 = yAp = gAp + j*bAp \text{ and } YAn/Y0 = yAn = gAn + j*bAn \quad (2)$$

$$YLp/Y0 = yLp = \sqrt{\frac{|yAp|^2 - gAp}{gAp - 1}}; \quad \alpha p = \arctan\left(\frac{1 - gAp}{bAp} \cdot yLp\right)$$

$$YLn/Y0 = yLn = \sqrt{\frac{|yAn|^2 - gAn}{gAn - 1}} \quad \alpha n = \arctan\left(\frac{1 - gAn}{bAn} \cdot yLn\right),$$

where $j^2 = -1$

The antenna system 1 can have real admittances GAp and GAn at the antenna connection gates 2a, 2b at the at least one frequency f1 so that YAp=GAp and Yan=GAn is given and the decoupling of the two decoupling network connection gates 4a, 4b and the admittance matching $S_{4a4a}=0$, $S_{4b4b}=0$ of the two decoupling network connection gates 4a, 4b to the reference conductance Y0 are established in that both the electrical angle αp=2π*l/λp of the symmetrical line 13 and the electrical angle αn=2π*l/λn of the antisymmetrical line 14 each amount to αp=αn=90° and the line wave conductance of the symmetrical line 13 $YLp=\sqrt{GAp*Y0}$ and the line wave conductance of the antisymmetrical line (14) $YLn=\sqrt{GAn*Y0}$ are selected, wherein λp und λn describe the wavelengths of the symmetrical and the antisymmetrical waves and are set as equal.

It may be that at the at least one frequency f1 at a respective one of the two decoupling network connection gates 4a, 4b, both on an excitation in the same sense and on an excitation in the opposite sense at the respective other decoupling network connection gate 4a, 4b, the same predefined admittance $$\frac{YNp}{Y0} = \frac{YNn}{Y0} = \frac{YN}{Y0} = yN = gN + j \cdot bN$$

related to Y0 is given in that, for the symmetrical line 13, the line wave admittance $$\frac{YLp}{Y0}$$

related to Y0 in accordance with $$YLp/Y0 = yLp = \sqrt{\frac{gN \cdot |yAp|^2 - gAp \cdot |yN|^2}{gAp - gN}}$$

$$\alpha p = 180/\pi \cdot \arctan\left(\frac{gN - gAp}{gN \cdot bAp + bN \cdot gAp} \cdot yLp\right) \quad (3)$$

are selected and it may be that, for the antisymmetrical line 14, the line wave admittance related to Y0 in accordance with $$YLn/Y0 = yLn = \sqrt{\frac{gN \cdot |yAn|^2 - gAn \cdot |yN|^2}{gAn - gN}}$$

$$\alpha n = 180/\pi \cdot \arctan\left(\frac{gN - gAn}{gN \cdot bAn + bN \cdot gAn} \cdot yLn\right) \quad (4)$$

are selected, whereby a decoupling of the two network connection gates 4a, 4b at the end of the coupled line 15 is achieved.

It may be that, to achieve the impedance matching to the standardized admittance Y0 at the network connection gates 4a, 4b for the at least one frequency f1, a mutually identical output matching network 25a,25b for transforming the admittance, which is in each case present at the line connection gates 4a', 4b' of the coupled electrical line 15, into the standardized admittance Y0 is inserted between each of the two mutually decoupled ends of the coupled electrical line—the line connection gates 4a', 4b'—and the corresponding decoupling network connection gate 4a, 4b.

It may be that, between each of the two antenna connection gates 4a, 4b and the connection to the corresponding conductor 8a, 8b of the coupled electrical line 15, a mutually identical antenna matching network 24a, 24b is connected by which the antenna admittances YAp and YAn respectively, which are present at the connection gates 4a, 4b, are transformed at the at least one frequency f1 into a real admittance GAp or GAn in each case and the coupled electrical line 15 is designed such that the line wave admittance of the symmetrical electrical line 13 amounts to YLp=$\sqrt{GAp*Y0}$ and the electrical angle of said symmetrical electrical line 13 amounts to $$\alpha p = \frac{l}{\lambda p} * 360 = 90°$$

and the line wave admittance of the antisymmetrical electrical line 14 amounts to YLn=$\sqrt{GAn*Y0}$ and the electrical angle of said antisymmetrical electrical line 14 amounts to $$\alpha n = \frac{l}{\lambda n} * 360 = 90°.$$

It may be that to achieve the real admittances GAp and GAn, each antenna matching network 24 is formed from a parallel two-terminal circuit, connected in parallel with the antenna connection gate 2a, 2b and having a susceptance Bp from at least one dummy element, and a series two-terminal circuit connected in series and having a reactance Xs from at least one dummy element, wherein Bp/Y0 and Xs/Z0 respectively have the following values at the at least one frequency f1 in order to satisfy the requirement YAp=GAp or YAn=GAn $$bp = Bp/Y0 = \frac{|zAn|^2 - |zAp|^2}{2*(xAp*|zAn|^2 - xAn*|zAp|^2)} * \left[ 1 \pm \sqrt{1 - \frac{4\cdot(xAp*|zAn|^2 - xAn*|zAp|^2)*(xAn - xAp)}{(|zAp|^2 - |zAn|^2)^2}} \right] \quad (5)$$

$$zAp = rAp + j\cdot xAp = \frac{ZAp}{Z0} = \frac{Y0}{YAp} \text{ and } zAn = rAn + j\cdot xAn = \frac{ZAn}{Z0} = \frac{Y0}{YAn}$$

where it applies:

It may be that, in each antenna matching network 24a, 24b, in the first of the alternative combinations, the parallel two-terminal circuit having a susceptance Bp is designed as a capacitive component having a capacitance Cp and the series two-terminal circuit having a reactance Xs is designed as an inductive component having an inductance Ls and it may be that, in the second of the alternative combinations, the parallel two-terminal circuit having a susceptance Bp is designed as an inductive component having an inductance Lp and the series two-terminal circuit having a reactance Xs is designed as a capacitive component having a capacitance Cs with an inductance Ls.

It may be that, to extend the frequency range around the at least one frequency f1 as a center frequency in which both an improvement of the decoupling between the network connection gates 4a, 4b and an improved impedance matching to the standard resistance Z0 are achieved, the parallel two-terminal circuit is designed as a parallel resonant circuit and the series two-terminal circuit is designed as a series resonant circuit.

It may be that the antenna matching network 24a, 24b is designed such that the frequency-dependent progression of the antenna impedance ZAp=1/YAp or ZAn=1/YAn transformed into the real admittance Gap or GAn in the complex impedance plane with an increasing frequency at least partly wraps around the real resistance value RAp=1/GAp or RAn=1/GAn with a small deviation in each case and the resistance value RAp or RAn is improved by the transformation with the coupled electrical line 15 into the reference resistance Z0 at the decoupling network connection gates 4a, 4b as well as the decoupling and the impedance matching over a larger frequency range around the frequency f1.

It may be that, to increase the frequency range around the at least one frequency f1, with an improved decoupling between the decoupling network connection gates 4a, 4b, starting from a realization of the mutually identical antenna connection networks 24a, 24b in accordance with a dimensioning indicated above of the parallel two-terminal circuit having a susceptance Bp and the series two-terminal circuit having a susceptance Xs, said parallel two-terminal circuit and series two-terminal circuit are supplemented in order in each case to form a parallel resonant circuit 7a connected in parallel and a series resonant circuit 7b connected in series.

It may be that, to increase the frequency range around the at least one frequency f1 with an improved decoupling and an improved impedance matching in a frequency range around the frequency f1 at the decoupling network connection gates 4a, 4b, the output matching network 25a, 25 in each case includes at least one parallel resonant circuit 7a and one series resonant circuit 7b that are designed such that both the impedance ZNp and the impedance ZNn at the decoupling network connection gates 4a, 4b in their progression in the complex impedance plane with an increasing frequency wrap around the standardized impedance Z0 at a small spacing.

It may be that the electrical properties of the coupled electrical line 15 are individually set by the structural design of the distributed capacitance Cm'=ΔCm/Δl, which is effective to ground over the conductor length l 10 of the individual electrical conductors 8a, 8b, and of the distributed capacitance Cb'=ΔCb/Δl of the individual conductors with respect to one another as well as by the distributed inductances Lp'=ΔLp/Δl for a current flow in the same sense in the two conductors and the distributed inductances Ln'=Δ Ln/Δl for a current flow in an opposite sense in the two conductors such that, for the frequency f1, the required values for the line wave conductance $$YLp = \frac{1}{ZLp} = \sqrt{Cm`/Lp`} \quad (6)$$

and for the electrical angle per unit length as a phase constant $$\frac{d\alpha p}{dl} = \beta p = 2\pi * f1 * \sqrt{Lp` * Cm`} \quad (7)$$

of the symmetrical electrical line 13 and the required values for the line wave conductance $$YLn = \frac{1}{ZLn} = \sqrt{(Cm` + 2*Cb`)/Ln`} \quad (8)$$

and for the electrical angle per unit length for the phase constant $$\frac{d\alpha n}{dl} = \beta n = 2\pi * f1 * \sqrt{(Cm` + 2*Cb`) * Ln`} \quad (9)$$

of the antisymmetrical electrical line 14 are reached.

To design a coupled electrical line 15 with the values required in accordance with the invention for YLp, YLn and the required electrical angles αp and αn, it may be advantageous to first determine the structure of the line that provides the required values for YLp, YLn and provides the values independent of the line length l 10 for the phase constants Pp and Pin such that their ratio Pp/βn=αp/αn is satisfied and the geometric line length l10 is selected in accordance with l=αp/βp=αn/βn.

It may be that the coupled electrical line 15 is designed as a microstrip line comprising conductor strips 17 on a permittive substrate 27 and the conductor width 26 is selected accordingly, taking into account the permittivity of the substrate 27 for achieving the desired capacitance assignment Cm' and the inductance assignment Lp' for designing the line wave admittance YLp and the phase constant Pp, and it may be that the conductor spacing 11 for designing the capacitance assignment Cb' and—under the effect of the assignment of the coupling inductance M'—the inductance assignment Ln' are selected such that the required line wave admittance YLn and the phase constant βn are set.

It may be that each of the mutually identical antennas 1a, 1b is formed as a monopole antenna 1a, 1b that is connected to ground 6 with one of its nadir terminals 2a', 2b' and that, in order to bridge the antenna spacing d, is connected to the associated antenna connection gate 2a, 2b via a respective identical short electrical ground-unsymmetrical line piece 35.

It may be that each of the mutually identical antennas 1a, 1b is in each case formed as a dipole antenna 1a', 1b' which is designed symmetrical to ground 6 and whose ground-symmetrical connection gate 2a', 2b' is in each case connected to the associated antenna connection gate 2a, 2b via a respective identical re-balancing arrangement 34 having a short ground-symmetrical input line and a ground-unsymmetrical output line for bridging the antenna spacing d and for re-balancing the ground-symmetrical dipole connection gate 2a2, 2b' with respect to the ground-unsymmetrical antenna connection gate 2a, 2b.

The two linear electromagnetically coupled conductors 8a and 8b of the decoupling network 3 with their consecutive infinitesimal line pieces of the length dl, consisting of the infinitesimal dummy elements dLp=dLn, dCm, dCb of the symmetrical coupled line 15, can be replaced by consecutive circuit stages S1, S2, . . . of a finite number N that correspond to the line pieces, but consist of discrete dummy elements. Instead of the infinitesimal dummy elements dLp, dLn, dCm, and dCb, discrete components corresponding thereto and having the series inductance ΔLp=ΔLs 36, the bridge capacitance ΔCb 38, and the ground capacitance ΔCm 37 are used and the decoupling of the decoupling network connection gates 4a, 4b can be set at a sufficiently lower frequency f1 than the cut-off frequency ftn.

The dummy elements 36, 37, 38 can each be replaced by a two-pole series dummy circuit 43, 44, 45 such that, at the decoupling frequency f1, it applies in each case: The series dummy circuit 43,43' used instead of the inductance ΔLp, ΔLs 36 is inductive and has the same reactance value as the inductance ΔLp, ΔLs 36. The bridge dummy circuit 45,45' used instead of the bridge capacitance ΔCb 38 is capacitive and has the same reactance value as the bridge capacitance ΔCb 38. The ground dummy circuit 44,44' used instead of the ground capacitance ΔCb 37 is capacitive and has the same reactance value as the ground capacitance ΔCb 37.

In the decoupling network 3, at least two stages S1, S2 . . . can be formed by whose first stage S1, in the cooperation of the inductive series dummy circuit 43 with the two-pole bridge dummy circuit 45, the decoupling at the decoupling network connection gate 4a, 4b for the frequency f1 can also be given in that a serial series resonant circuit 46 which is permeable for this frequency f1 is present in the series dummy circuit 43' of the second stage S2 and a serial parallel resonant circuit 47 which is blocking for this frequency f1 is present in the bridge dummy circuit 45'. The decoupling at the decoupling network connection gate 4a, 4b can at a further frequency f2 be given by a matching in accordance with the invention of the series dummy circuit 43 and the bridge dummy circuit 45'.

The decoupling network 3 designed as a low-pass structure can, however, be realized dually thereto as a high-pass structure, for which purpose the
inductance ΔLp=ΔLs 36 is replaced by the series capacitance ΔCs 42,
the bridge capacitance ΔCb 38 is replaced by the bridge inductance ΔLm 41,
and the ground capacitance ΔCm 37 is replaced by the ground inductance ΔLm 40. The magnitudes of the series capacitance ΔCs 42, of the ground capacitance ΔCm 37, and of the ground inductance ΔLm 40 can be selected in accordance with the high-pass structure elements obtained by a dual transformation of the low-pass structure elements while applying the duality formation rules and the decoupling of the decoupling network connection gates 4a, 4b can be set at a sufficiently higher frequency f1 than the cut-off frequency fhp.

BRIEF DESCRIPTION OF DRAWINGS

The invention will be explained in more detail in the following with reference to embodiments. The associated Figures show in detail.

Figure 1:
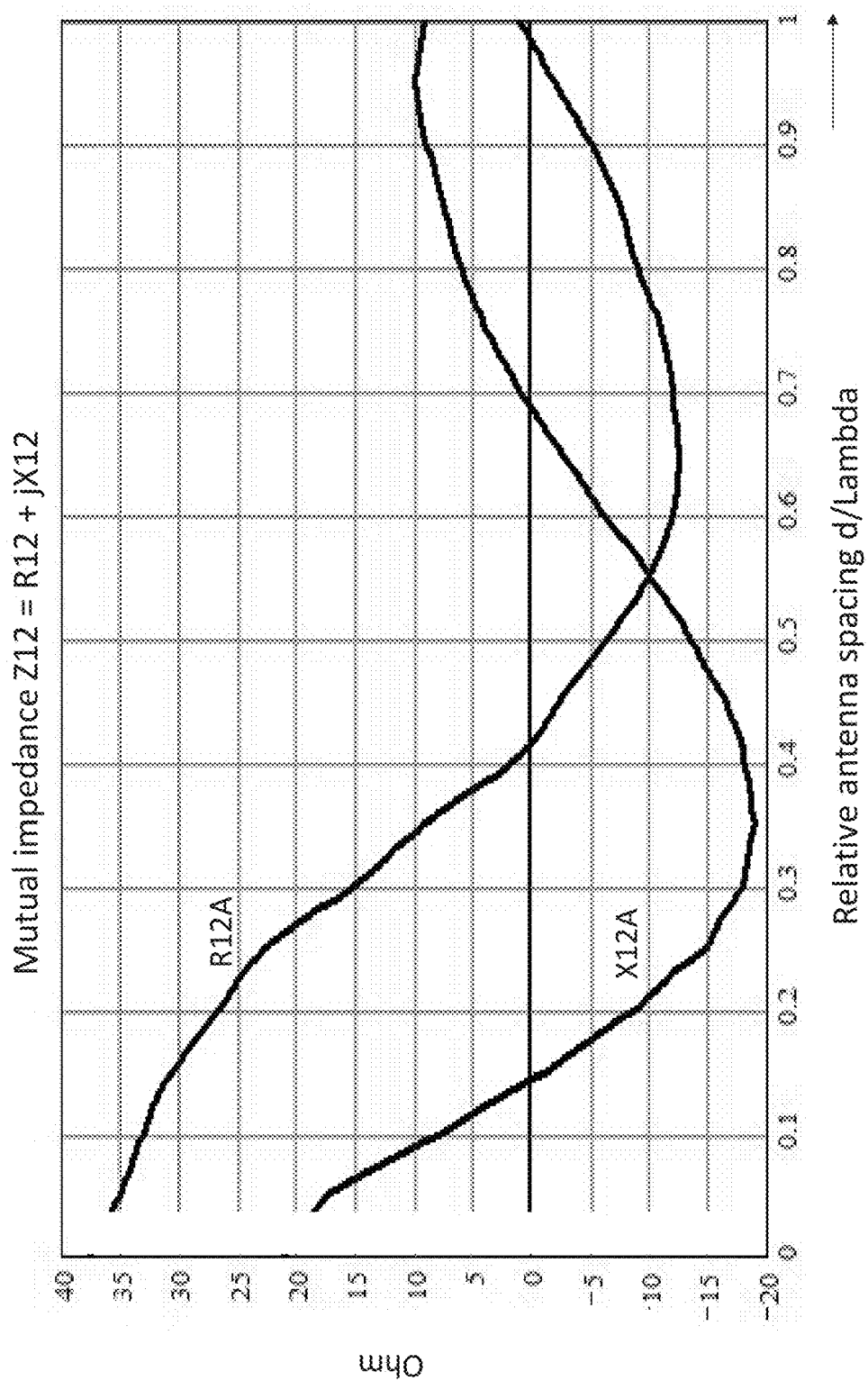
FIG. 1.

a) An example of an antenna system 1 comprising two identical mutually radiation coupled antennas 1a, 1b arranged at a spacing of d from one another, arranged symmetrically with respect to one another, and having a respective antenna connection gate 2a, 2b in accordance with the prior art. Each antenna is separately connected to a transmission-reception device 16a, 16b.

b) A four-pole or two-port equivalent circuit of the antenna system 1 having the complex antenna impedances ZA=RA+j*XA and the complex coupling impedance Z12A=R12A+j*X12A for detecting the radiation coupling between the antenna connection gates 2a, 2b c) A progression of the real part R12A and the imaginary part X12A of the coupling impedance Z12A in dependence on the antenna spacing d/λ0 related to the free-space wavelength λ0 using the example of two rod-shaped antennas oriented in parallel with one another in accordance with a) with the relative height h/λ=0.25.

FIG. 2:

a) A progression of the real part R12A and the imaginary part X12A of the coupling impedance Z12A using the example of the antenna system at a) in dependence on the frequency at a relative antenna spacing at 750 MHz of d/λ=0.2 b) Scattering parameters of the transmission factor S2a2b between the antenna connection gates 2a and 2b and of the reflection factor S2a2a or S2b2b at the antenna connection gate 2a or 2b, in each case on the termination of the other gate with Z0.

FIG. 3:

a) An antenna system 1 comprising two identical radiation coupled antennas 1a, 1b in accordance with the prior art having a respective antenna path 15a, 15b to a transmission-reception device 16a, 16b, said antenna paths 15a, 15 being separately associated with an antenna.

b) A principle diagram of an antenna system 1 in the plan view with a decoupling network 3 having a coupled line 15 for decoupling the network connection gates 4a, 4b in accordance with the invention and the transmission-reception devices 16a, 16b connected thereto.

FIG. 4:

a) An antenna system 1 comprising two identical radiation coupled antennas 1a, 1b having two linear electrical conductors 8a, 8b of a formed coupled line 15 as a decoupling network 3 in accordance with the invention having the decoupling network connection gates 4a, 4b. The two linear electrical conductors 8a, 8b are guided over the common length l 10 both at a conductor spacing 11 in parallel with one another and at a ground spacing 12 in parallel with the ground plane 9. Due to the two linear electrical conductors 8a, 8b, both a symmetrical electrical line 13 related to the ground 6 and, between the two linear electrical conductors 8a, 8b, an antisymmetrical electrical line 14 related to one another are formed. The wave impedance and the electrical angles αp and αn respectively of both the symmetrical and the antisymmetrical electrical lines 13, 14 in the coupled electrical line 15 are designed such that, at least one frequency f1, the coupling $S_{4a4b}$ present between the decoupling network connection gates 4a, 4b is substantially smaller, due to the use of the network 3, than the coupling $S_{2a2b}$ present between the corresponding antenna connection gates 2a, 2b.

b) A plan view of the antenna system 1 with a decoupling network 3 as in a)

FIG. 5:

a) to b) An explanation for the detection of the properties of the antenna system 1 on the basis of its symmetrical impedance equivalent circuit (ZA) with respect to the antenna connection gates 2a, 2b by determining the following impedances a) A detection of the impedance ZAp=RAp+jXAp=1/YAp e.g. at the antenna connection gate 2b that occurs on the excitation of said antenna connection gate 2b with a measurement signal U and on a simultaneous excitation of the other decoupling network connection gate 2a with the same measurement signal U polarized in the same sense b) A detection of the impedance ZAn=RAn+jXAn=1/YAn at the antenna connection gate 2b that occurs on the excitation of said antenna connection gate 2b with a measurement signal U and on a simultaneous excitation of the other decoupling network connection gate 2a with the same but oppositely polarized measurement signal −U c) to d) An explanation for the detection of the properties of the antenna system 1 on the basis of its admittance equivalent circuit (YA) with respect to the antenna connection gates 2a, 2b by determining the following admittances c) A detection of the admittance YAp=GAp+jBAp=1/ZAp at the antenna connection gate 2b that occurs on the excitation of said antenna connection gate 2b with a measurement signal U and on a simultaneous excitation of the other decoupling network connection gate 2a with the same measurement signal U polarized in the same sense d) A detection of the admittance YAn=GAn+jBAn=1/ZAn at the antenna connection gate 2b that occurs on the excitation of said antenna connection gate 2b with a measurement signal U and on a simultaneous excitation of the other decoupling network connection gate 2a with the same but oppositely polarized measurement signal −U.

With the relationship YAp=1/ZAp and YAn=1/ZAn

In perfect analogy to this, the properties of the antenna system 1 having a network 3 in accordance with the invention are detected on the basis of its symmetrical impedance equivalent circuit (ZN) with respect to the mutually symmetrical decoupling network connection gates 4a, 4b by determining the impedances $$ZNp=RNp+jXNp=1/YNp \text{ and } ZNn=RNn+jXNn=1/YNn$$

and on the basis of its symmetrical admittance equivalent circuit (YN) by determining the admittances $$YNp=GNp+jBNp=1/ZNp \text{ and } YNn=GNn+jBNn=1/ZNn.$$

Figures e) and f).

A detection of the electrical properties—expressed by the real wave impedances states ZLp=1/YLp and ZLn=1/YLn, which are assumed to be loss-free, and of the electrical angles αp and αn of the symmetrical and the antisymmetrical electrical lines 13, 14 of the coupled electrical line 15, which is released at its one end from the antenna connection gates 2a, 2b, based on the following susceptances present at the other end of the electrical line 15.

On a short-circuit of both conductors to ground 6 at the one end, the following susceptances result at the other end.

Susceptance Bkp at one of the network connection gates 4a, 4b on its excitation with a measurement signal U and on a simultaneous excitation of the other decoupling network connection gate 4a, 4b with the same measurement signal U polarized in the same sense Susceptance Bkn at one of the network connection gates 4a, 4b on its excitation with a measurement signal and on a simultaneous excitation of the other decoupling network connection gate 4a, 4b with the same but oppositely polarized measurement signal −U In an open-circuit operation of both conductors to ground 6 at the one end, the following susceptances accordingly result at the other end.

Susceptance Blp at one of the network connection gates 4a, 4b on its excitation with a measurement signal U and on a simultaneous excitation of the other decoupling network connection gate 4a, 4b with the same but oppositely polarized measurement signal U Susceptance Bln at one of the network connection gates 4a, 4b on its excitation with a measurement signal and on a simultaneous excitation of the other network connection gate 4a, 4b with the same but oppositely polarized measurement signal −U

FIG. 6:

An illustration of the formation of the wave impedances ZLp, ZLn and of the electrical angles αp and αn of the symmetrical and the antisymmetrical electrical lines 13 and 14 based on the representation of the coupled line 15 by finite elements for the individual design of the capacitances Cm'=DCm/dl, distributed over the conductor length l 10, of the individual electrical conductors 8a, 8b to ground and Cb'=dCb/dl of the individual conductors 8a, 8b with respect to one another and the distributed inductance Lp'=dLp/dl for currents flowing in the same sense in both conductors and Ln'=dLn/dl for currents flowing in opposite senses in both conductors, influenced by the distributed magnetic coupling M'=dM/d1, 21 of the two conductors.

FIG. 7:

A plan view of an antenna system 1 having a coupled electrical line 15 in accordance with the invention with the particular feature that the symmetrical admittance YAp and the asymmetrical admittance Yn present at the antenna connection gates 2a and 2b arranged symmetrically with respect to one another are each real at the at least one frequency f1 so that the following applies:

$Y1=GAp$ and $Yn=GAn$.

The decoupling S4a4b and the admittance matching S4a4a=0, S4b4b=0 of the two output connection gates 4a, 4b to the reference conductance Y0 are established in that both the electrical angle αp=2λ*l/λp of the symmetrical line 13 and the electrical angle αn=2π*l/λn of the antisymmetrical line 14 each amount to αp=αn=90° and the line wave conductance of the symmetrical line 13 YLp=√(GAp*Y0) and the line wave conductance of the antisymmetrical line 14 YLn=√(GAn*Y0) are selected.

Figure 4:
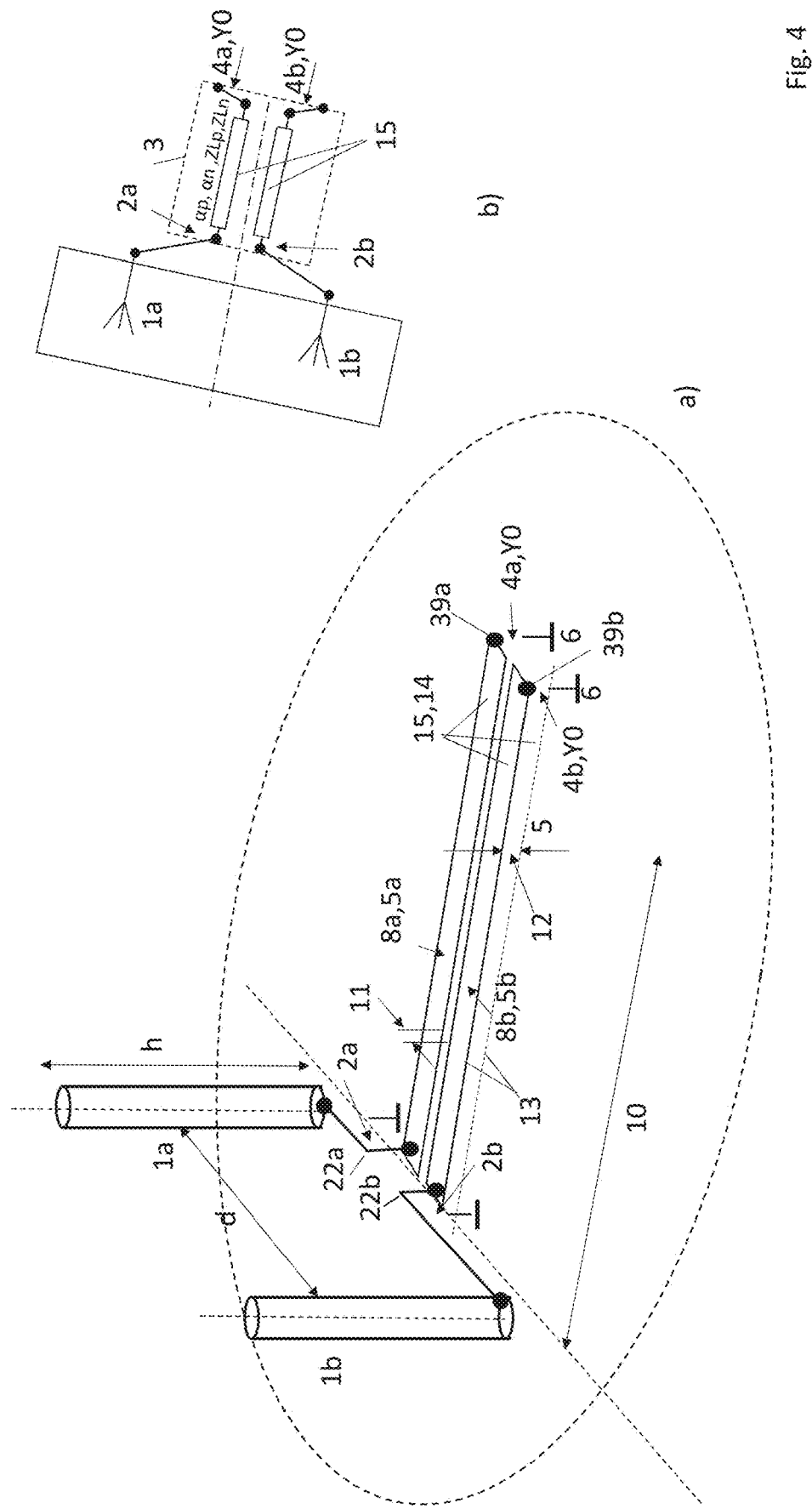
Figure 5:
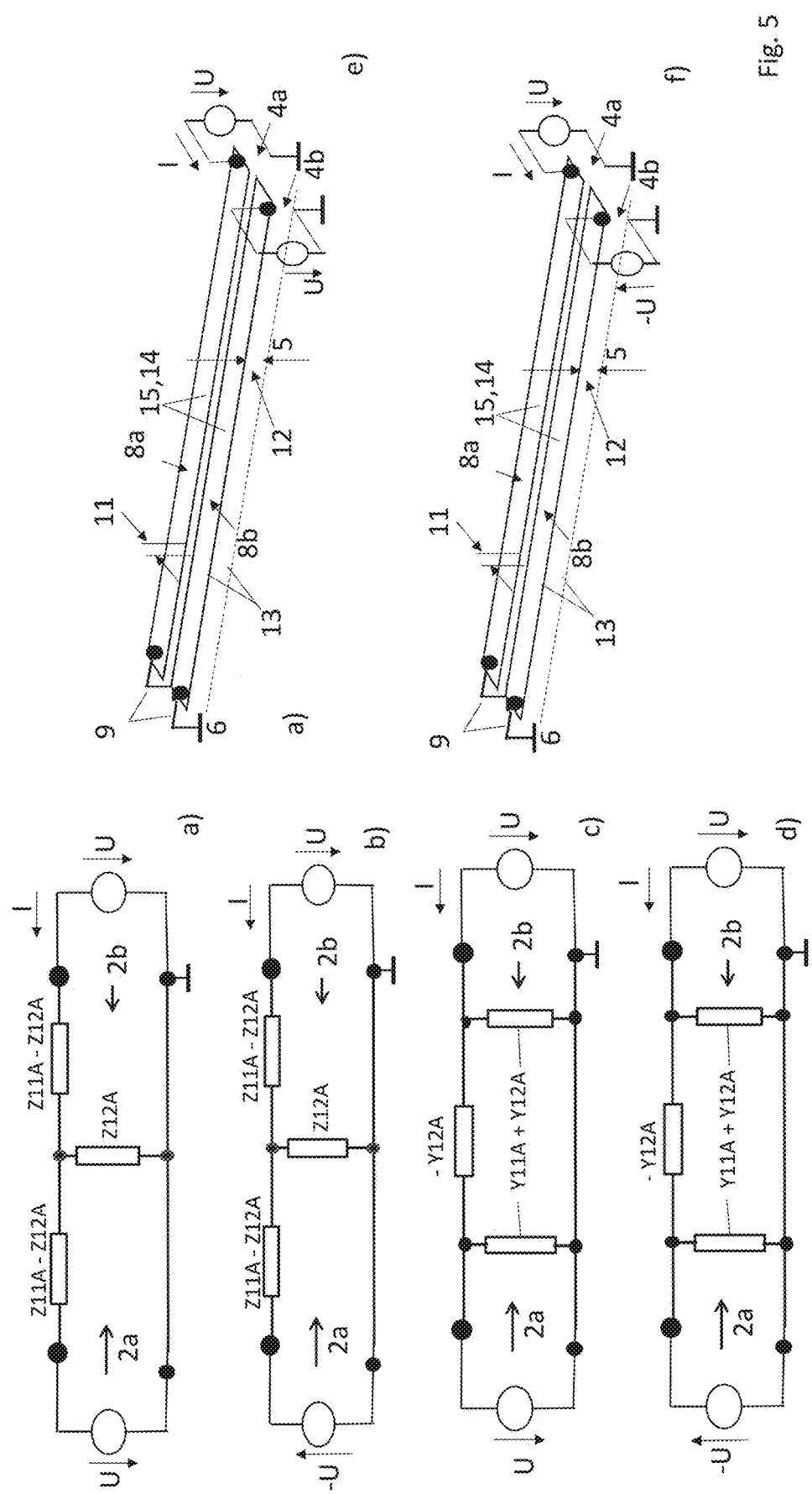

FIG. 8:

a) A frequency dependence of the scattering parameter S4a4b in dB around the frequency f1=700 MHz as a measure for the decoupling between the decoupling network connection gates 4a, 4b of the antenna system 1 with the coupled line 15 in accordance with FIG. 4. In the frequency range around the low decoupling at f1=700 MHz, a coupling of −15 dB over a frequency bandwidth of 30 MHz and a coupling of −20 dB over a frequency bandwidth of 16 Mhz result.

As a comparison thereto, the scattering parameter S2a2b shows the radiation coupling of the two antennas at the antenna connection gates 2a, 2b at a spacing from one another of d/λ0=0.2 at the frequency f1.

b) A frequency dependence of the scattering parameter S4a4b in dB around the frequency f1=700 MHz as a measure for the reflection factor at a respective decoupling network connection gate 4a or 4b on the termination of the other decoupling network connection gate 4b or 4a with the standard conductance Y0.

As a comparison thereto, the scattering parameter S2aS2b shows the reflection factor at a respective antenna connection gate 2a or 2b on the termination of the other decoupling network connection gate 2b or 2a with the standard conductance Y0.

Figure 7:
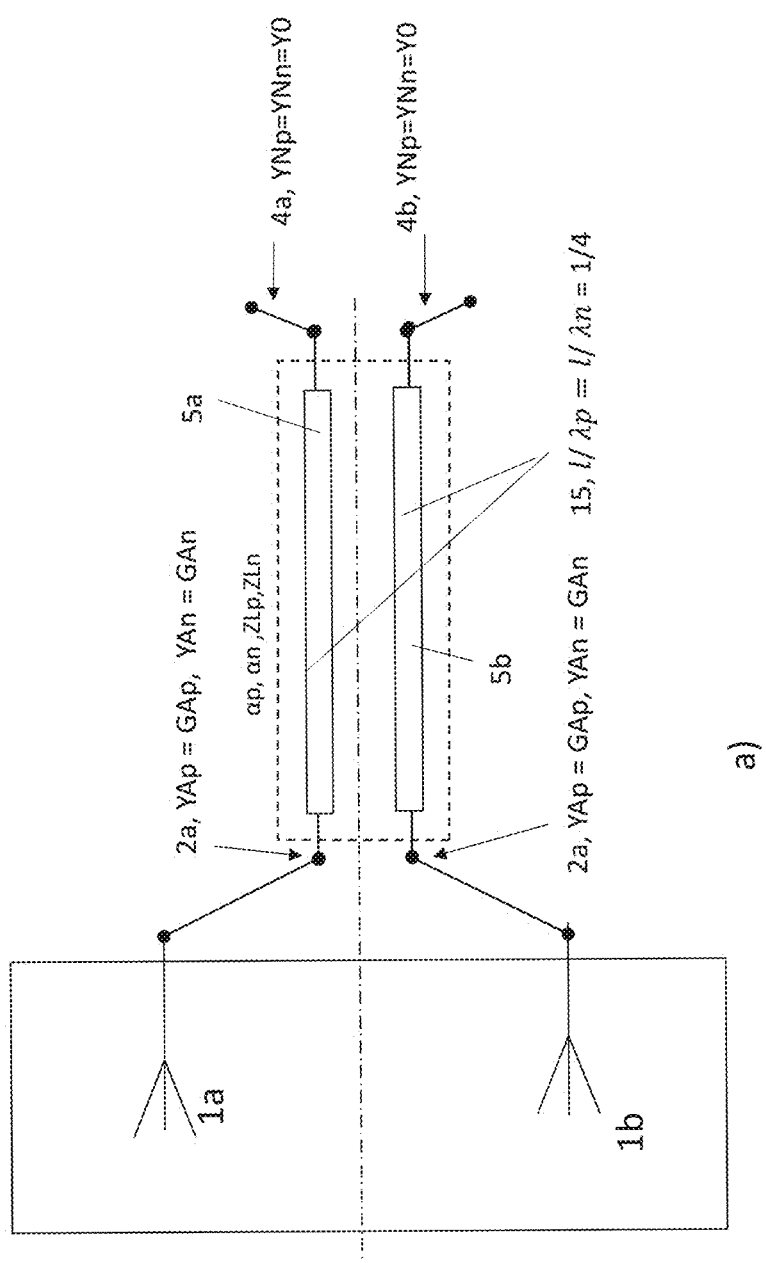

FIG. 9:

a) A plan view of the antenna system 1 with a coupled electrical line 15, as in FIG. 7, but with the difference that the admittances YAp and YAn at the antenna connection gates 2a, 2b are not real at the frequency f1 and the coupled electrical line 15 is designed such that the line wave admittance YLp and the electrical angle αp of the symmetrical electrical line 13 as well as the line wave admittance YLn and the electrical angle αn of the antisymmetrical electrical line 14 are designed in accordance with the indicated relationships for the frequency f1 in each case such that the symmetrical and the asymmetrical admittance are equal at both decoupling network connection gates 4a', 4b' in each case so that YNp=YNn applies and thus the two decoupling network connection gates 4a', 4b' are decoupled from one another.

As in Figure a) but with the difference that, to achieve the impedance matching to the standardized admittance Y0 at the decoupling network connection gates 4a, 4b for the at least one frequency f1, a mutually identical output matching network 25 for transforming the admittance, which is in each case present at both ends of the coupled electrical line 15, into the standardized admittance Y0 is inserted between each of the two mutually decoupled ends of the coupled electrical line 15—the line connection gates 4a', 4b'—and the corresponding decoupling network connection gate 4a, 4b.

FIG. 10:

a) An antenna system 1 with a coupled electrical line 15 as in FIG. 4, but with the difference that, between each of the two antenna connection gates 2a, 2b and the connection to the corresponding conductor 8a, 8b of the coupled electrical line 15, a mutually identical antenna matching network 24a, 24b is connected by which the antenna admittances YAp and YAn respectively, which are present at the antenna connection gates 2a, 2b, are transformed at the at least one frequency f1 into a real admittance GAp or GAn in each case and the coupled electrical line 15 is designed such that the line wave admittance of the symmetrical electrical line 13 amounts to YLp=√(Gap*Y0) and the electrical angle of said symmetrical electrical line 13 amounts to $$\frac{l}{\lambda p} * 360 = 90°$$

and the line wave admittance of the antisymmetrical electrical line 13 amounts to YLn=√(Gan*Y0) and the electrical angle of said antisymmetrical electrical line 13 amounts to $$\frac{l}{\lambda n} * 360 = 90°$$

and the mutually decoupled decoupling network connection gates 4a, 4b are adapted to the standard admittance Y0.

b) A schematic plan view of the arrangement in Figure a.

FIG. 11:

a) A schematic plan view as in FIG. 10b, but with the particular feature that each antenna matching network 24a, 24b is formed from a parallel two-terminal circuit, connected in parallel with the antenna connection gate 2a, 2b and having a susceptance Bp from at least one dummy element, and a series two-terminal circuit connected in series and having a reactance Xs from at least one dummy element, whose values Bp/Y0 and Xs are selected in accordance with the functions of ZAn and ZAp indicated further below. To design an improved admittance matching over a larger frequency bandwidth to the standard conductance Y0, a respective output matching network 25a, 25b is connected downstream of the coupled line 15 at the line connection gates 4a', 4b', as shown in FIG. 9b, and its output now forms a respective one of the decoupling network connection gates 4a, 4b.

There are shown:

a) As in a), but Bp realized as a positive parallel susceptance 28 and Xs realized as a positive series reactance 29.

b) As in a), but Bp realized as a negative parallel susceptance 30 and Xs realized as a negative series reactance 31.

FIG. 12:

One of the curves shown in the Cartesian reflection factor diagram related to Z0 shows the progression of the symmetrical antenna impedance ZAp at a respective one of the antenna connection gates 2a, 2b on an excitation in the same sense of the respective other one of the antenna connection gates 2a, 2b with an increasing frequency and the impedance point Zp at the frequency f1. In correspondence thereto, the other curve shows the progression of the antisymmetrical antenna impedance ZAn at a respective one of the antenna connection gates 2a, 2b, but on an excitation in the same sense of the respective other one of the antenna connection gates 2a, 2b with an increasing frequency and the impedance point Zn at the frequency f1.

Starting from the impedance points Zp and Zn, each antenna connection network 24a, 24b with the values for Bp—realized by Lp—and Xs—realized by Cs—indicated in FIG. 11d for one of the two solution options transforms the symmetrical impedance Zp into the real resistance RAp and likewise transforms the antisymmetrical impedance Zn into the real resistance RAn. Subsequently thereto, the coupled electrical line 15 designed in accordance with FIG. 10 with its symmetrical electrical line 13 having the line wave admittance YLp and l/λp=¼ transforms the real resistance RAp into the matching point Z0 and, in correspondence thereto, the antisymmetrical electrical line 14 having the line wave admittance YLn and l/λn=¼ equally transforms the real resistance RAn into the matching point Z0, whereby, at the frequency f1, a complete decoupling between the decoupling network connection gates 4a, 4b is achieved by the coupled electrical line 15.

Figure 10:
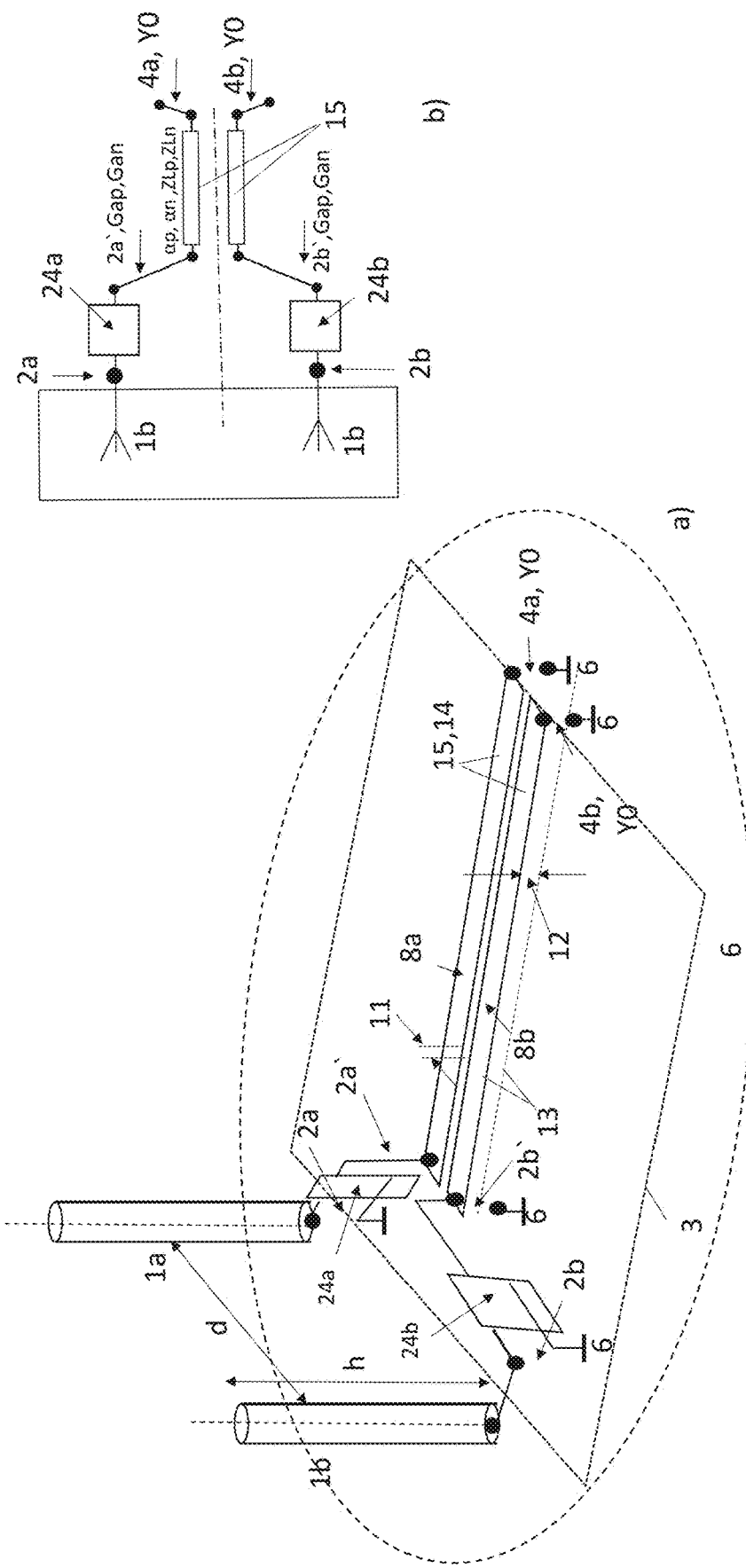
Figure 12:
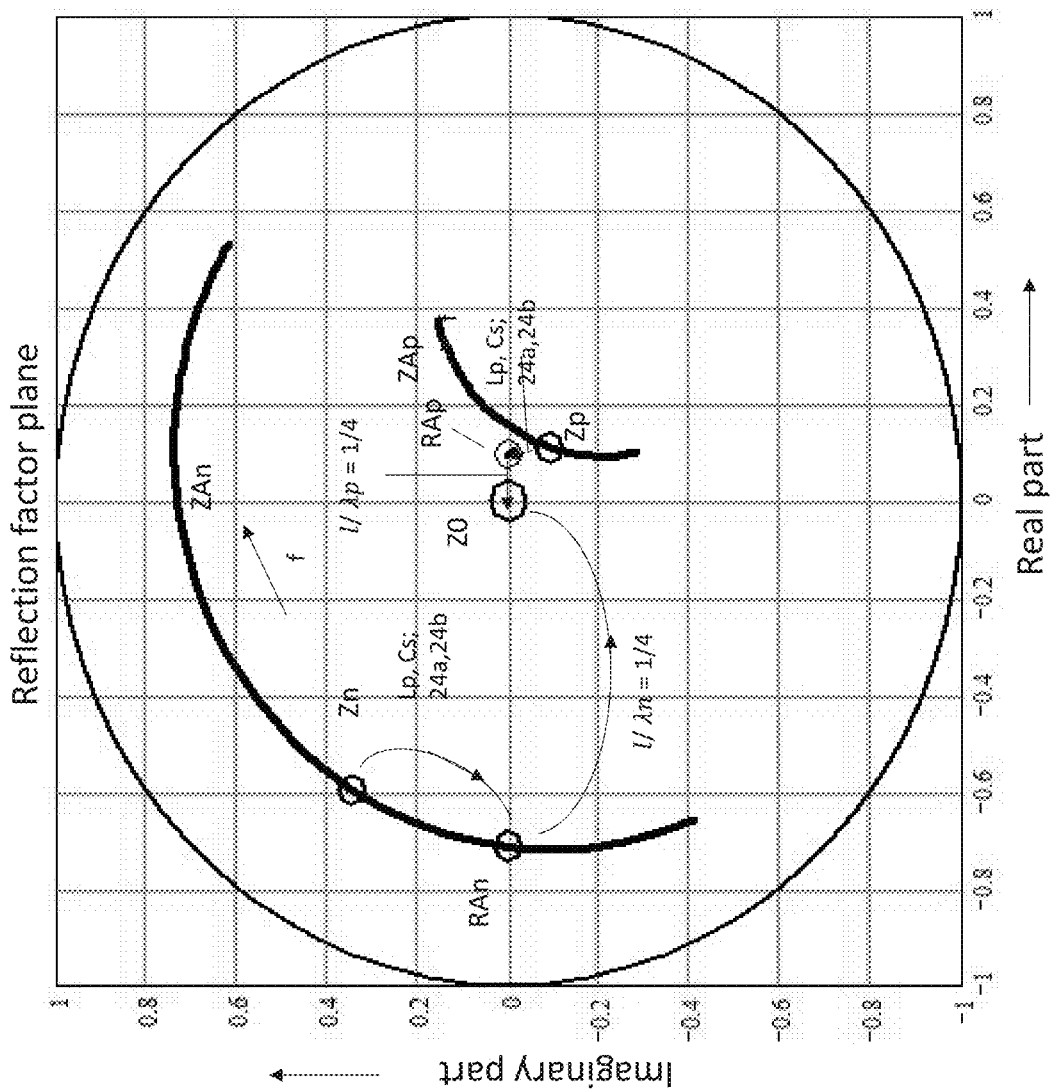

FIG. 13:

a) A frequency dependence of the scattering parameter S4a4b in dB around the frequency f1=700 MHz as a measure for the decoupling between the decoupling network connection gates 4a, 4b of the antenna system 1 with a coupled line 15 in accordance with FIGS. 10 to 12. In the frequency range around the low decoupling at f1=700 MHz, a coupling of <−15 dB results over a frequency bandwidth of 28 MHz and a coupling of <−20 dB results over a frequency bandwidth of 15 Mhz.

As a comparison thereto, the scattering parameter S2aS2b shows the radiation coupling of the two antennas at a spacing from one another of d/λ0=0.2 at the frequency f1.

b) A representation as in Figure a), but with a greater frequency resolution

Figure 13:
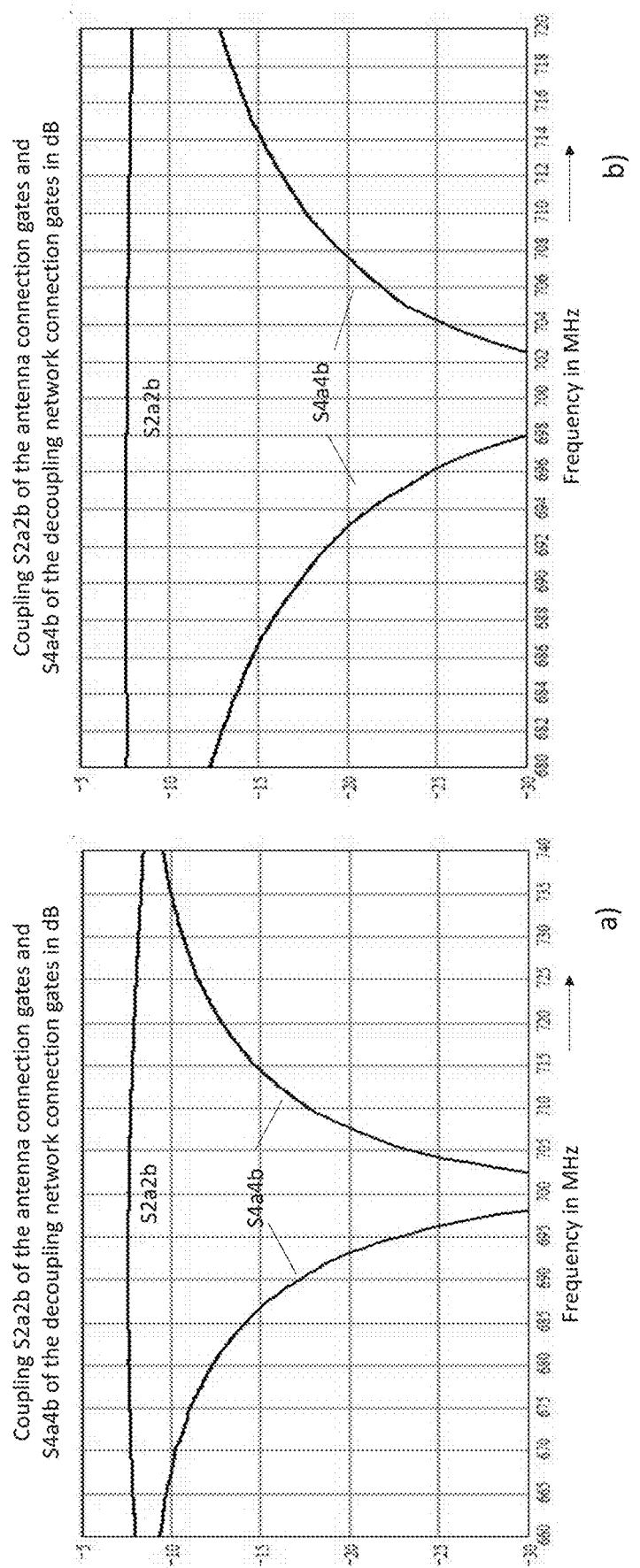
Figure 15:
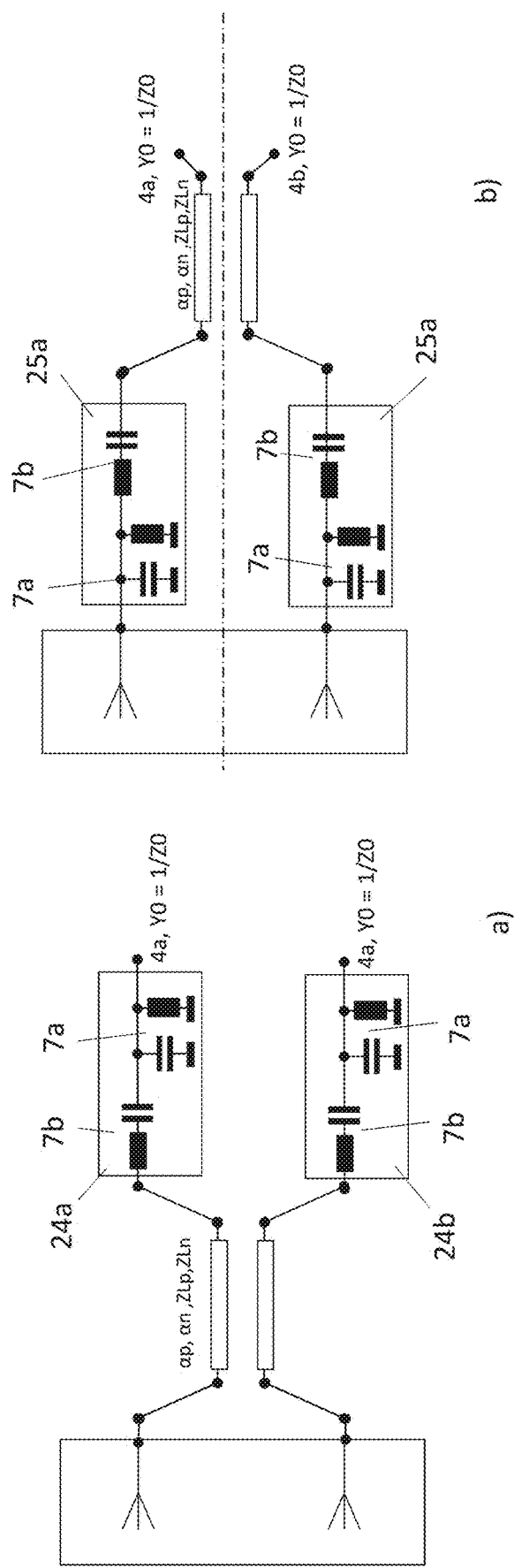

FIG. 14:

a) Corresponding to FIG. 13a:

A representation of the frequency dependence of the scattering parameter S4a4b in dB around the frequency f1=700 MHz as a measure for the reflection factor at a respective decoupling network connection gate 4a or 4b on the termination of the respective other decoupling network connection gate 4b or 4a with the standard conductance Y0=1/Z0.

As a comparison thereto, the scattering parameter S2aS2b shows the reflection factor at a respective antenna connection gate 2a or 2b on the termination of the respective other decoupling network connection gate 2b or 2a with the standard conductance Y0=1/Z0.

b) A representation as in Figure a), but with a greater frequency resolution

FIG. 15:

a) To design an improved admittance matching to the standard conductance Y0 with the two output matching networks 25a, 25b in the arrangement in FIG. 9b at the decoupling network connection gates 4a, 4b over a greater frequency bandwidth, a parallel resonant circuit 7a connected in parallel and a series resonant circuit 7b connected in series are in each case used in the output matching networks 25a, 25b.

b) To increase the frequency range with an improved decoupling between the decoupling network connection gates 4a, 4b around the at least one frequency f1, starting from a realization of the mutually identical antenna connection networks 24a, 24b in accordance with a dimensioning of the two two-terminal circuits from dummy elements as in FIG. 11a, said two two-terminal circuits are supplemented in order in each case to form a parallel resonant circuit 7a connected in parallel and a series resonant circuit 7b connected in series.

Figure 16:
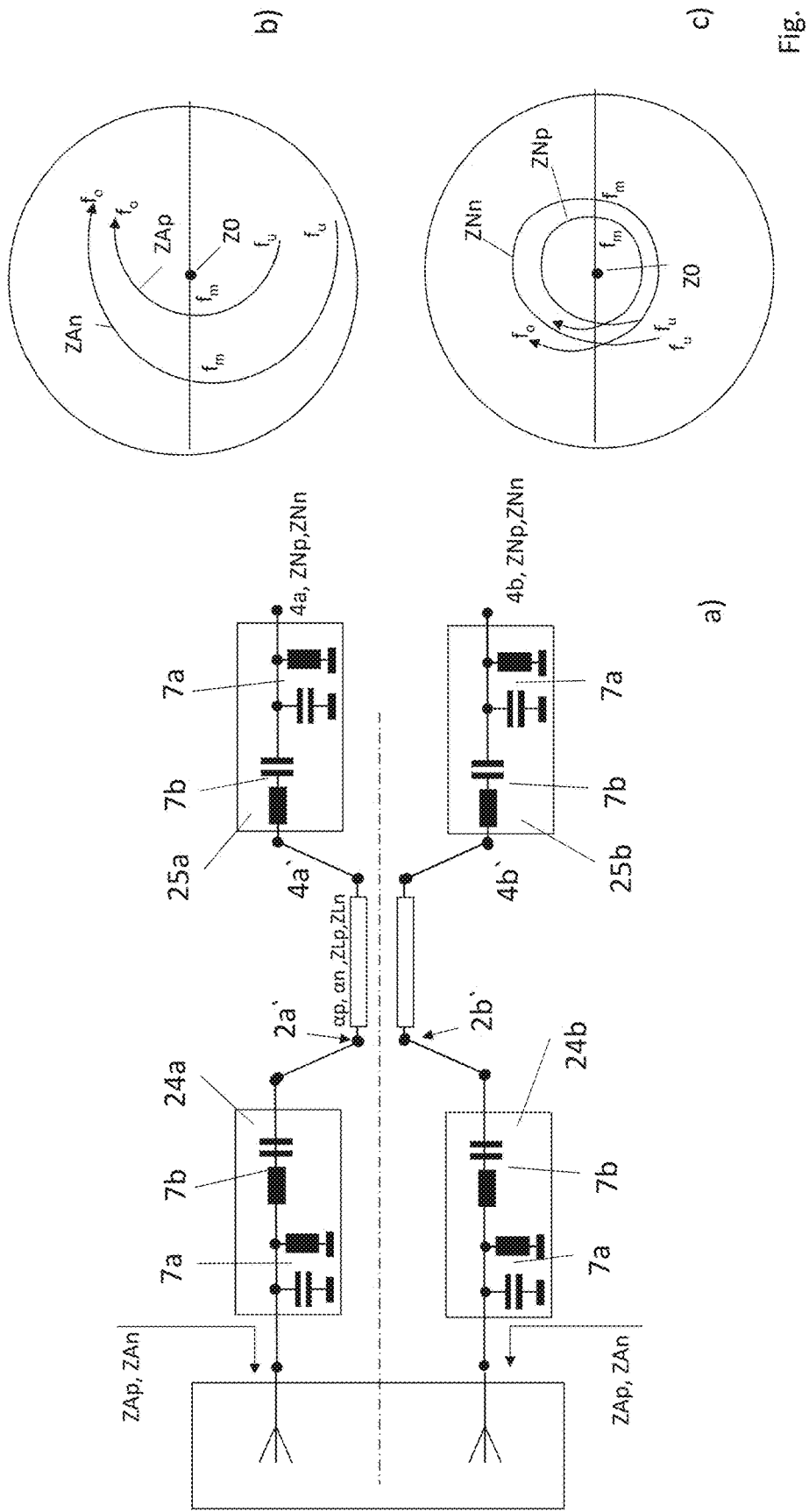

FIG. 16:

a) To increase the frequency range by a frequency range around the frequency f1 with an improved decoupling and an improved impedance matching at the network connection gates 4a, 4b, in each case at least one parallel resonant circuit 7a and one series resonant circuit 7b are present in the output matching network 25a, 25b in FIG. 16a and are designed such that both the impedance ZNp and the impedance ZNn at the decoupling network connection gates 4a, 4b in their progression in the complex impedance plane with an increasing frequency wrap around the standardized impedance Z0 at a small spacing.

b) A typical progression of the symmetrical antenna impedance ZAp and of the antisymmetrical antenna impedance ZAn in the complex reflection factor plane with an increasing frequency f related to the standardized impedance Z0 for an impedance matching. Both courses partly wrap around the matching point Z0. The spacing between the courses results from the radiation coupling of the two antennas 1a,1b.

c) In combination with the antenna matching network 24a, 24a and the coupled electrical line 15 designed in accordance with the invention, the antenna matching network 25a, 25a is designed such that the impedance progressions for ZAp and ZAn in Figure b) are transformed such that, at a small spacing from one another with an increasing frequency f, they jointly wrap around the impedance point Z0 for impedance matching at a small deviation therefrom, whereby a broad sufficient decoupling of the two decoupling network connection gates 4a, 4b from one another is achieved in accordance with the invention.

FIG. 17:

An exemplary frequency dependence of the scattering parameters around the frequency f1=700 MHz as a measure for the broadband decoupling between the network connection gates 4a, 4b of the antenna system 1 with a coupled line 15. In the frequency range around f1=700 MHz, an improved decoupling over a larger frequency range results while dispensing with a low decoupling.

a) To design an improved admittance matching over a greater frequency bandwidth to the standard conductance Y0, in the example, a respective output matching network 25a, 25b is connected downstream of the coupled line 15 at the line connection gates 4a, 4b', as shown in FIG. 9b, and its output now forms a respective one of the decoupling network connection gates 4a, 4b.

b) To transform the antenna admittances, in the example—as in FIG. 10—, between each of the two antenna connection gates 2a, 2b and the corresponding connection to the coupled electrical line 15, a mutually identical antenna matching network 24a, 24b is connected by which the antenna admittance, which is in each case present at an antenna connection gate 2a, 2b, is transformed into a mutually identical real admittance GAp or GAn.

In a) and in b), the coupling or reflection factors are each shown as scattering parameters in dB related to Z0=1/Y0=50 Ohm.

There are shown in each case:

Curve 1: A frequency progression of the coupling of the antenna connection gates 2a, 2b based on the progression of the scattering parameter S2a2b in dB.

Curve 2: A frequency progression of the coupling of the network connection gates 4a, 4b based on the progression of the scattering parameter S4a4b in dB.

Curve 3: A frequency progression of the reflection factor S2a2a=S2b2b in dB in each case at one of the antenna connection gates 2a, 2b.

Curve 4: A frequency progression of the reflection factor S4a4a=S4b4b in dB in each case at one of the network connection gates 4a, 4b.

FIG. 18:

a) A realization of the coupled electrical line 15 as a microstrip line comprising conductor strips 17 on a permittive substrate 27. The conductor width 26 is selected accordingly, taking into account the permittivity of the substrate 27 for achieving the desired capacitance assignment Cm' and the inductance assignment Lp' for designing the line wave admittance YLp. Likewise, the conductor spacing 11 for designing the capacitance assignment Cb' and the assignment of the coupling inductance M', which is included in the inductance assignment Lp', is selected such that the required line wave admittance YLn and the phase constant Pin as well as YLp and the phase constant Pin are set. The setting of the characteristics can preferably and effectively take place by a simulation model of the coupled line 15. For this purpose, said coupled line 15 is divided in cross-section as in Figure b) along its plane of symmetry into two halves that each include only one conductor 8a, 8b. In the symmetrical case—symmetrical excitation (positive), this takes place by terminating the plane of symmetry with a magnetic wall and, in the antisymmetrical case (negative), this takes place by terminating the plane of symmetry with an electric wall.

b) A simulation model for the cross-section of a symmetrical microstrip line 13 in accordance with Figure a) for determining the wave impedance ZLp c) A simulation model for the cross-section of an antisymmetrical microstrip line 14 in accordance with Figure a) for determining the wave impedance ZLn d) A coupled electrical line 15, realized as a two-wire line with round conductors, with a conductor diameter 23 and a conductor spacing 11 above a ground plane at a ground spacing 19 e) An example as in Figure d), but a symmetrical double line with a round tube-shaped shielding

FIG. 19:

a) An antenna system 1 in accordance with the invention comprising monopole antennas 1a, 1b having a respective identical short electrical ground-unsymmetrical line piece 35 for bridging the antenna spacing d.

b) An antenna system 1 in accordance with the invention comprising dipole antennas 1a, 1b' having a respective identical re-balancing arrangement 34 having a short ground-symmetrical input line and a ground-unsymmetrical output line for bridging the antenna spacing d and for re-balancing the ground-symmetrical dipole connection gate 2a, 2b' with respect to the ground-unsymmetrical antenna connection gate 2a, 2b.

Figure 6:
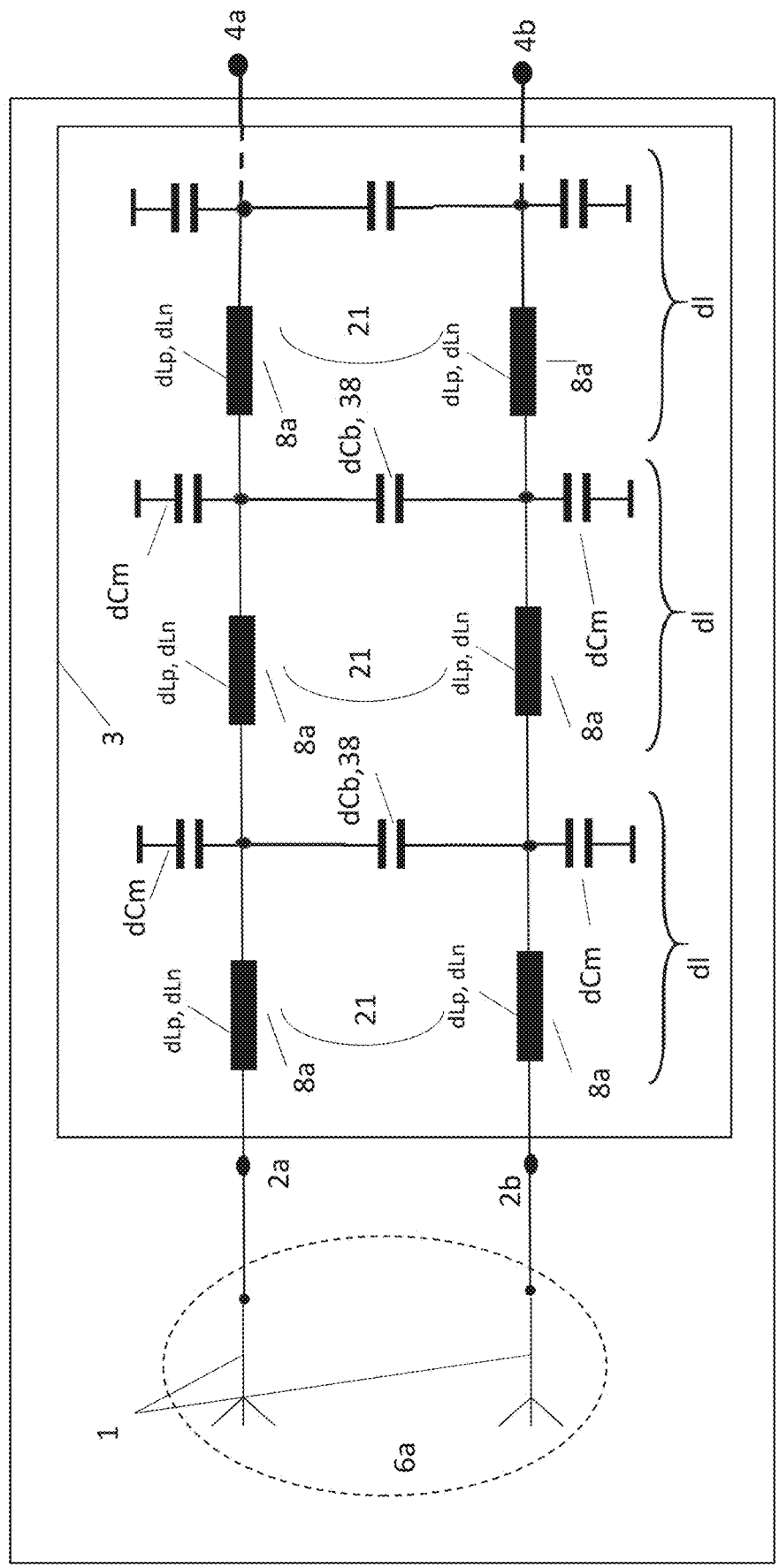

FIG. 20:

Shows the equivalent circuit analogous to FIG. 6 for the two linear electromagnetically coupled conductors 8a and 8b of the decoupling network 3 in accordance with the invention, but with concentrated electrical components. For this purpose, the consecutive infinitesimal line pieces of the length dl, consisting of the infinitesimal dummy elements dLp=dLn, dCm, dCb of the symmetrical coupled line 15, are replaced by consecutive circuit stages S1, S2, . . . of a sufficient number N consisting of discrete dummy elements. Instead of the infinitesimal dummy elements dLp, dLn, dCm and dCb, discrete components corresponding thereto and having the series inductance ΔLp=ΔLs 36, the bridge capacitance ΔCb 38, and the ground capacitance ΔCm 37 are used. The number of circuit stages S1, S2, . . . and the values of the discrete components are selected such that the decoupling of the decoupling network connection gates 4a, 4b is set at a sufficiently lower frequency f1 than the cut-off frequency ftn. For a matching to the standardized wave conductance Y0=1/Z0 of the decoupling network 3 at the decoupling network connection gates 4a, 4b, the related wave conductances YLp/Y0 and YLn/Y0 and the electrical angles αp and αn of the reproduced electrical line are required from the complex antenna admittances YAp/Y0 and YAn/Y0 in accordance with equation (2). In perfect analogy to the electrical line with distributed dummy elements, the wave conductances YLp and YLn and the electric angles αp and αn are determined from the short-circuit and open-circuit admittances Blp, Bkp, Bln, Bkn in the same sense and in the opposite sense from the equations (1).

The line wave impedance ZLp=1/YLp equivalent to the coupled line 15 for an excitation in the same sense is as follows $$YLp = \frac{1}{ZLp} = \sqrt{\Delta Cm/\Delta Lp} \tag{18a}$$

and the following results for the associated electrical angle of the circuit $$\alpha p = 2\pi * f1 * \sqrt{\Delta Lp * \Delta Cn} * N. \tag{18b};$$

The line wave impedance ZLn=1/YLn equivalent to the coupled line 15 for an excitation in the same sense is as follows $$YLn = \frac{1}{ZLn} = \sqrt{(\Delta Cm + 2*\Delta Cb)/\Delta Ln} \quad (18c)$$

and the following results for the associated electrical angle of the circuit $$\alpha n = 2\pi * f1 * \sqrt{(\Delta Cm + 2*\Delta Cb)*\Delta Ln}*N \quad (19)$$

Figure 20:
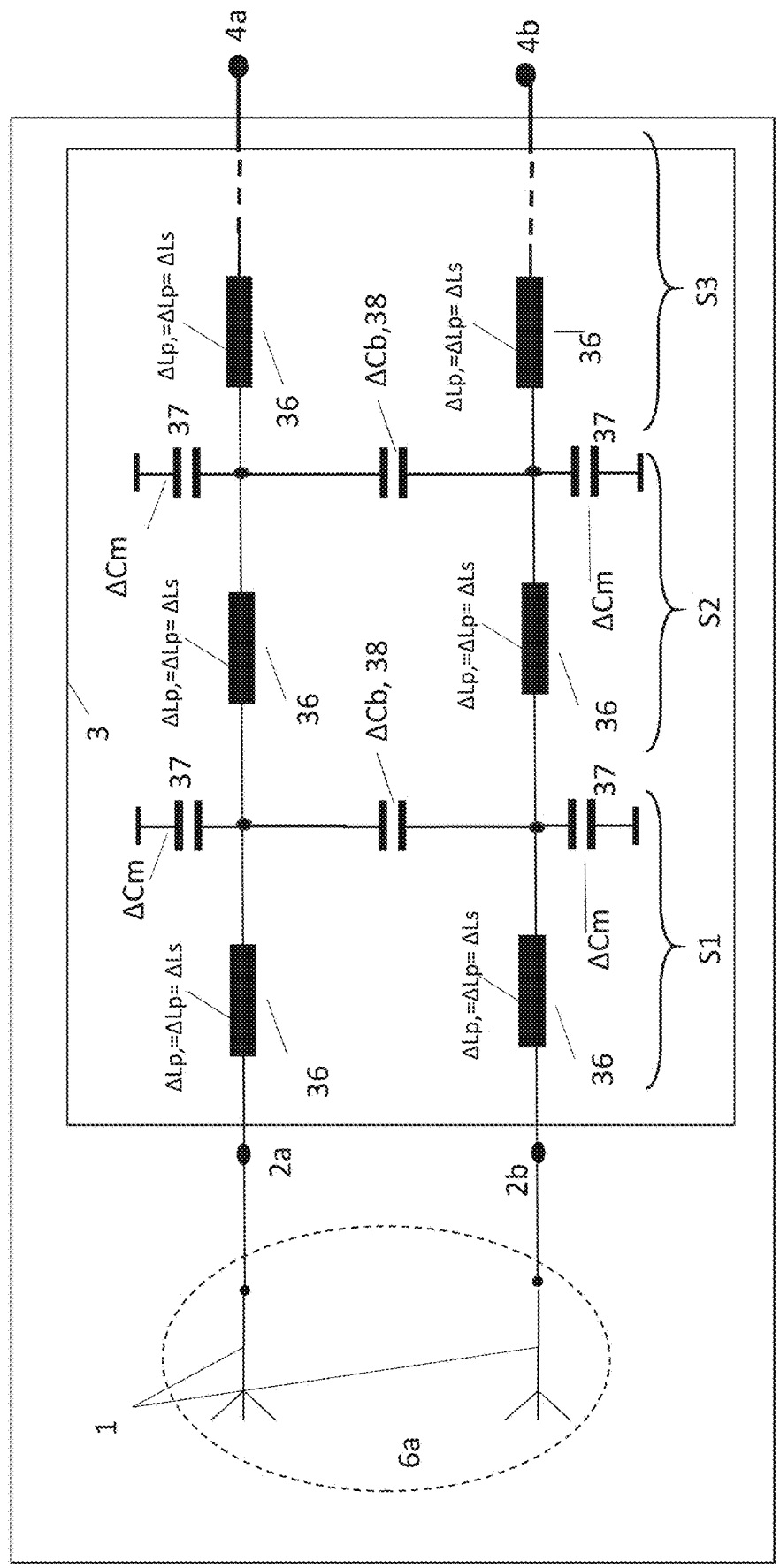

To achieve the matching to the standardized resistance Z0=1/Y0 at the decoupling network connection gates 4a, 4b in FIG. 20 at the decoupling frequency f1, the setting of the wave impedances ZLp and ZLn and the setting of the electrical angles αp and αn of the decoupling network 3 are required that result from the antenna admittances YAp and YAn based on the equations (2).

For the present considerations, it is necessary to select the decoupling frequency sufficiently below the cut-off frequency ftn of a circuit stage having a low-pass structure. The following applies for the cut-off frequency ftn:

$$ftn = 1/2\pi * \sqrt{(\Delta Cm + 2*\Delta Cb)*\Delta Ln} \quad (20)$$

Thus, the smallest necessary number N of stages for the electrical angle πn from the equation (19) of the circuit is given by $$N = \alpha n * ftn * f1$$

The electrical properties of the continuous electrical line composed of the linear electrical conductors 8a, 8b—consisting of their infinitely small elements—are achieved by the reproduced electrical line composed of concentrated components all the more precisely, the greater the number N of stages for the electrical angle αn is selected. For this purpose, the ratio $$\frac{f1}{ftn} < 0.5$$

should be selected.

In this way, the linear electrical conductors 8a, 8b in FIGS. 7, 9, 11, 15, 16 can, in perfect analogy, in each case be replaced by the reproduced coupled electrical line consisting of concentrated components in order to achieve the same decoupling and matching at the decoupling network connection gates 4a, 4b.

FIG. 21:

Shows the decoupling network 3 in accordance with the invention as in FIG. 20, in which, however, in all the stages S1, S2 . . . , the discrete inductive components of the inductance ΔLp, ΔLs 36 are each replaced by a discrete two-pole series dummy circuit 43, the discrete capacitive components having the bridge capacitance ΔCb 38 are each replaced by a discrete two-pole bridge dummy circuit 45, and the discrete capacitive components having the ground capacitance ΔCm 37 are each replaced by a discrete two-pole ground dummy circuit 44. For all the used dummy circuits for forming the decoupling at the decoupling frequency f1, it applies that in each case the replacing dummy circuit 43, 44, 45 is designed such that it has the sufficiently identical reactance value at the decoupling frequency f1 and in its frequency environment as the discrete dummy element to be replaced.

Figure 21:
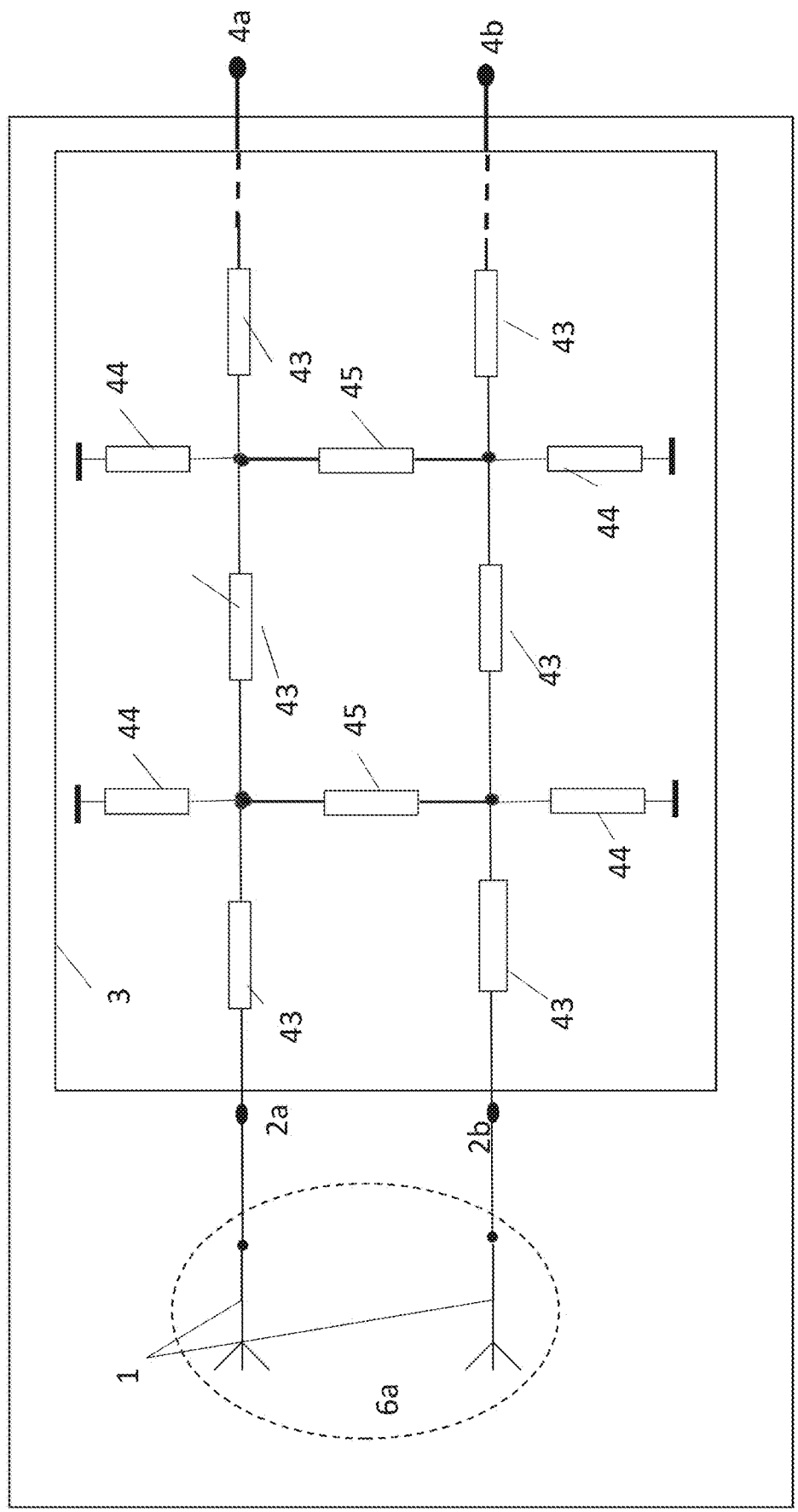

FIG. 22:

Shows the decoupling network 3 as in FIG. 21 in accordance with the invention in which a decoupling between the decoupling network connection gates 4a, 4b is achieved at two frequencies f1 and f2 with only two but mutually unequal stages S1 and S2. In the cooperation of the inductive series dummy circuit 43 with the two-pole bridge dummy circuit 45 of the first stage S1, the decoupling at the decoupling network connection gate 4a, 4b for the frequency f1 is given in that the second stage S2 is designed permeable for the first frequency f1. This permeability is achieved in that a serial series resonant circuit 46 which is permeable for this frequency f1 is present in the series dummy circuit 43' of the second stage S2 and a serial parallel resonant circuit 47 which is blocking for this frequency f1 is present in the bridge dummy circuit 45' in order not to impair the decoupling achieved. The decoupling at the decoupling network connection gate 4a, 4b at a further frequency f2 is given by a matching in accordance with the invention of the series dummy circuit 43' and the bridge dummy circuit 45'. The output matching networks 25a, 25b connected downstream have no influence on the decoupling and are present solely for the impedance matching. Similarly, the two antenna matching networks 24a, 24b serve solely for the transformation of the antenna impedance at their outputs that are also coupled due to the radiation coupling of the antennas.

Figure 22:
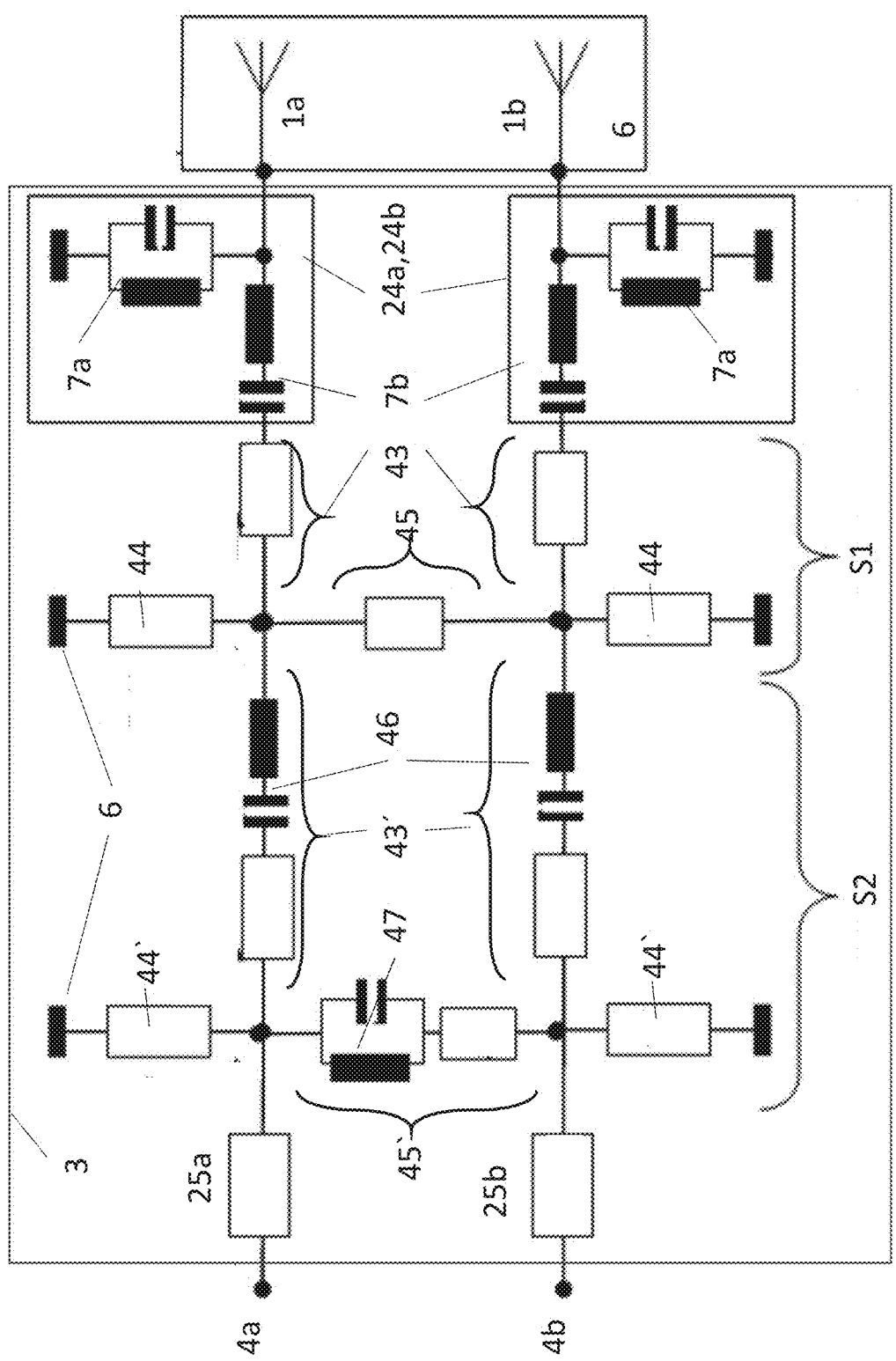

FIG. 23:

A frequency progression of the coupling of the decoupling network connection gates S4a4b of the decoupling network 3 in dB in FIG. 22 for the low decoupling at the frequencies f1 and f2.

FIG. 24:

An antenna system 1 in accordance with the invention as in FIG. 21, but having a decoupling network 3 having only one stage S1, consisting of the two discrete two-pole series dummy circuits 43 inductive at the frequency f1 and having the reactance X1, the discrete two-pole bridge dummy circuit 45 which effects the decoupling at frequency f1, which is capacitive at the frequency f1 and which has the admittance B, and the discrete ground dummy circuit 44 for impedance matching.

With the mutually identical radiation coupled antennas 1a, 1b, for the frequency f1, the reactance X1 is calculated from the antenna admittances YAp=GAp+jBAp and YAn=GAn+jBAn in the same sense and in the opposite sense; the reactance X1 required for the decoupling at the frequency f1 with a pure susceptance B1 is determined as follows. For this purpose, two values are possible for X1:

$$X11 = \frac{GAp*BAn - GAn*BAp + \sqrt{GAp*GAn*|YAp-YAn|^2}}{GAp*|YAn|^2 - GAn|YAp|^2} \text{ and} \quad (21)$$

$$X12 = \frac{Gap*Ban - Gan*BAp - \sqrt{Gap*Gan*|Yap-Yan|^2}}{GAp*|YAn|^2 - GAn|YAp|^2}.$$

Thus, X1=X11 or X1=X12 is selected.

With the value selected therefrom for X1, a decoupling between the decoupling network connection gates 4a, 4b is achieved independently of the discrete ground dummy circuit 44 by $$B1 = Blp - Bln \quad (22)$$

with the values $$B1p = \frac{BAp - X1*|YAp|^2}{X1^2*|YAp|^2 - 2*X1*BAp + 1}$$

and

-continued $$B1n = \frac{BAn - X1 * |YAn|^2}{X1^2 * |YAn|^2 - 2 * X1 * BAn + 1}$$

FIG. 25:

In a complete duality to the line replica in accordance with the invention that is shown in FIG. 20, that is designed from discrete components ΔLp=ΔLs, ΔCb, Δcm, and that has the character of a low-pass structure, the line replica shown in the present Figure is designed with a high-pass structure consisting of a series of stages S1, S2 . . . , each having two series capacitances ΔCs, a bridge inductance ΔLb, and two ground inductances ΔLm.

Figure 25:
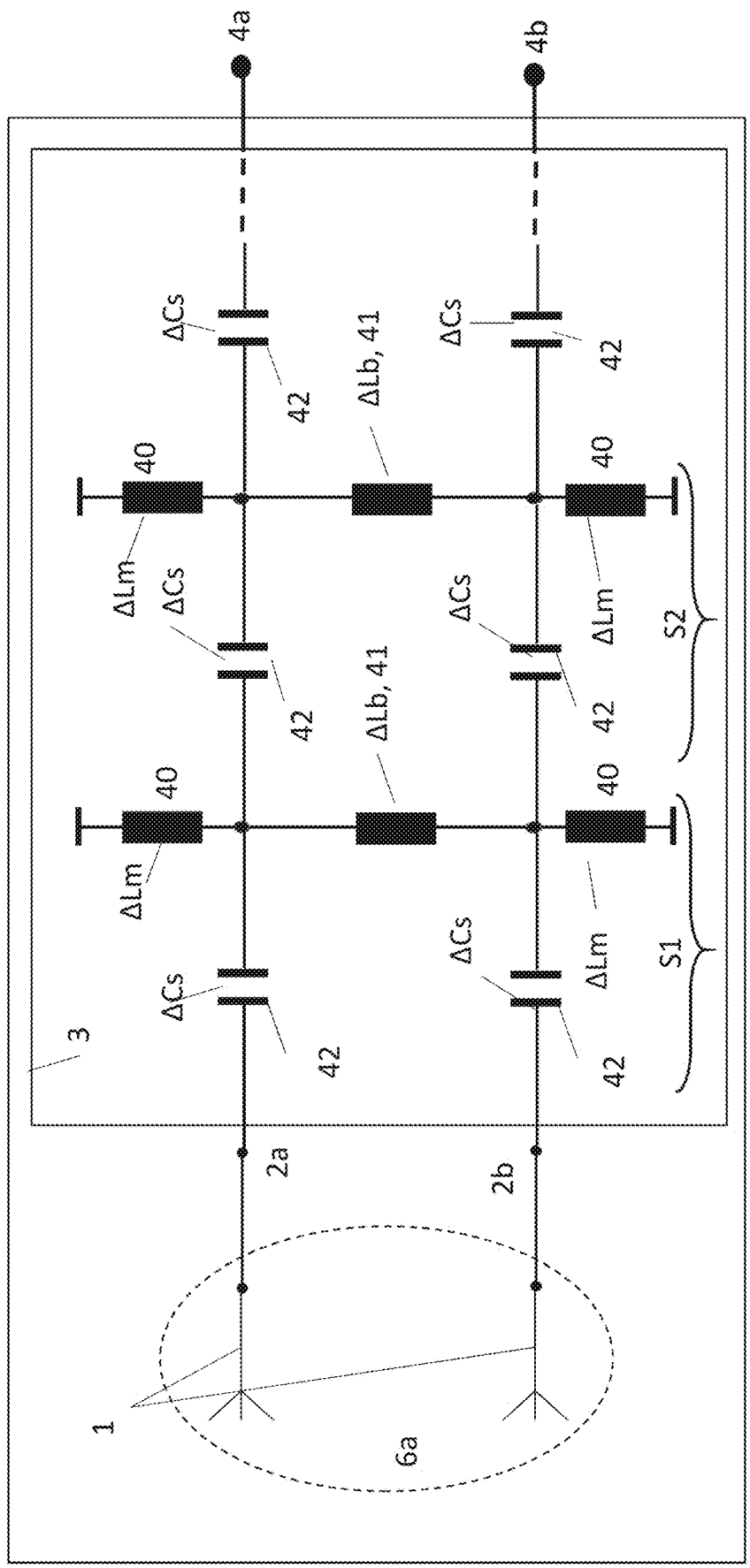
Figure 26:
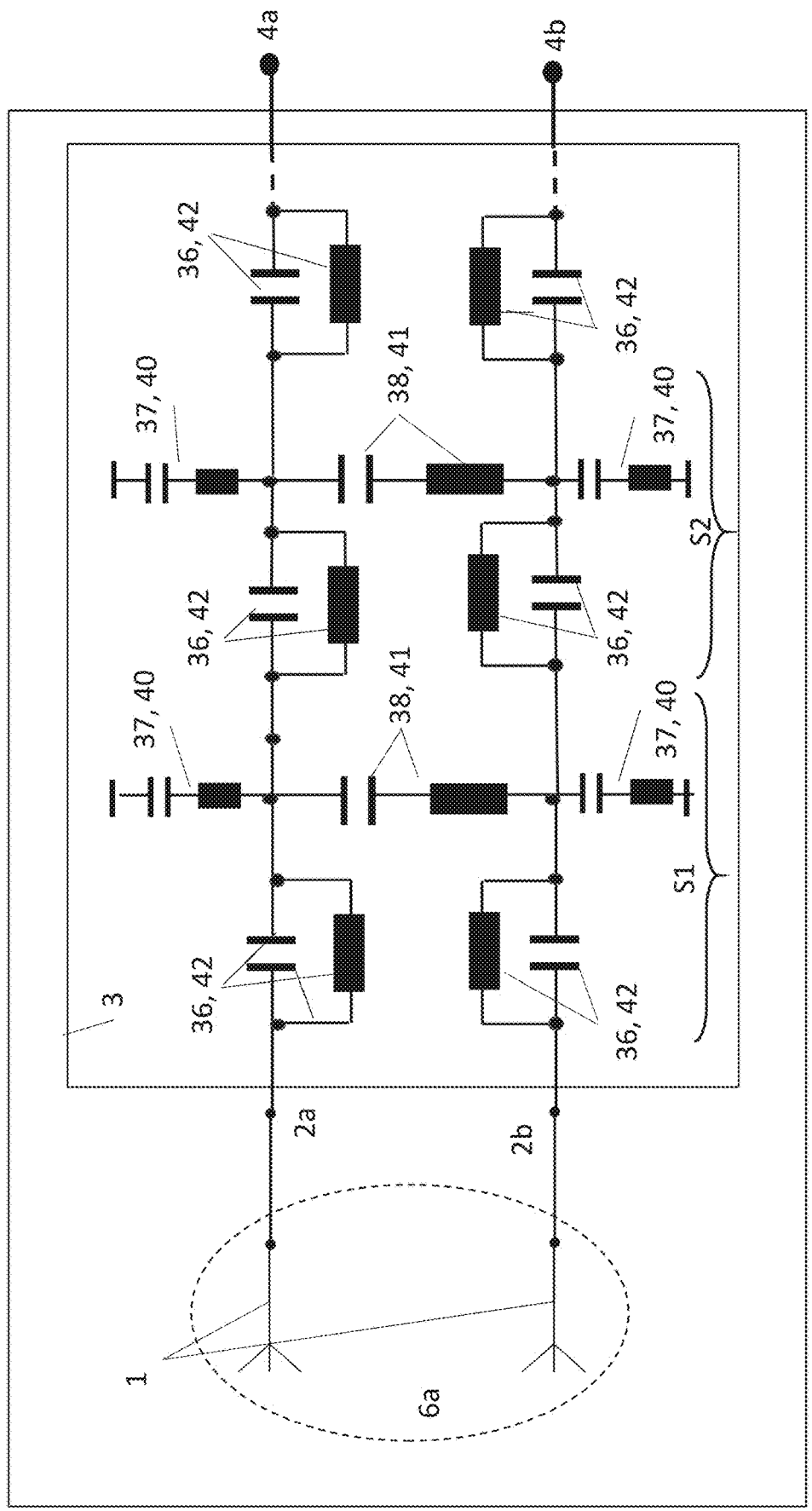

Due to a dual transformation of the circuit in FIG. 20, on an excitation in the same sense, the wave impedance of the equivalent line in FIG. 25 results as $$ZLp = \sqrt{\frac{\Delta Lm}{\Delta Cs}}$$

and on an excitation in the opposite sense results as $$ZLn = \sqrt{\frac{\Delta Lm * \Delta Lp}{\Delta Cs * (\Delta Lb + 2 * \Delta Lm)}}.$$

Accordingly, the cut-off frequency of a stage having a high-pass structure with respect to the excitation in an opposite sense results in $$fhn = \frac{1}{2\pi} * \sqrt{\frac{\Delta Lb + 2 * \Delta Lm}{\Delta Cs * \Delta Lm * \Delta Lp}}$$

To achieve a sufficiently good matching at frequencies in the frequency range of the decoupling frequency f1 and at frequencies thereabove, the ratio f1/fhn>2 should be maintained.

FIG. 26:

Shows the merging of the decoupling network 3 shown in FIG. 20, having a line replica, which is formed from concentrated dummy elements and which has a low-pass structure, with the decoupling network 3 shown in FIG. 25 having a line replica that is formed from concentrated dummy elements and that has a high-pass structure. With the combined structure, a decoupling network 3 is provided by whose low-pass structure property a decoupling is achieved at a low frequency f1 and by whose high-pass structure property a decoupling is achieved at a higher frequency f2 in each case.

Figure 23:
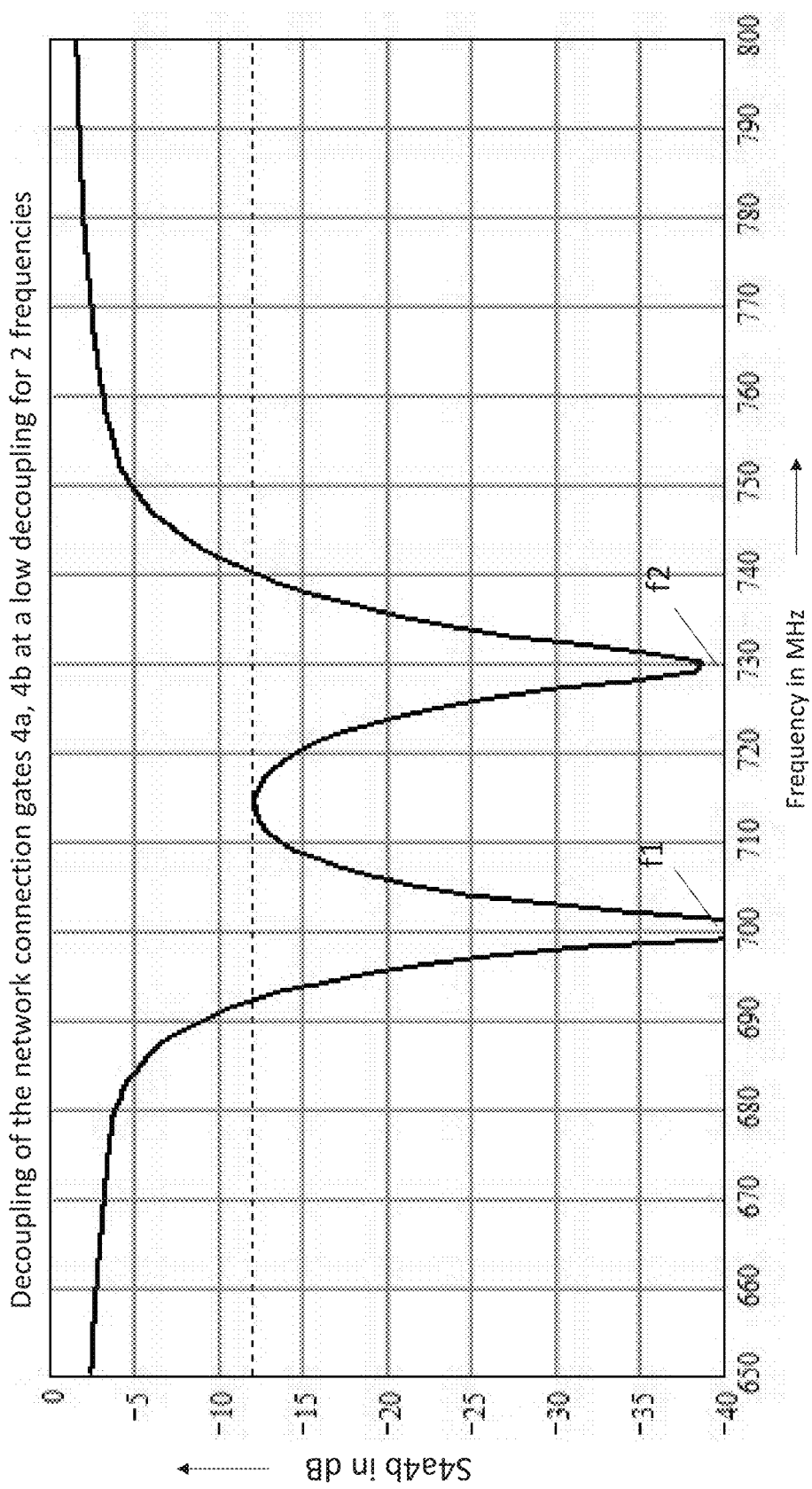

In the combined structure, the series individual elements 36 and 42 in FIGS. 20 and 25 are in each case replaced by a parallel resonant circuit 36, 42 that has the positive reactance value ΔLs of the low-pass structure at the low frequency f1 and correspondingly has the negative reactance value ΔCs of the high-pass structure at the higher frequency f2. In the combined structure, the ground individual elements 37 and 40 in FIGS. 20 and 25 are in each case replaced by a series resonant circuit 37, 40 that has the negative ground reactance value Δcm of the low-pass structure at the low frequency f1 and correspondingly has the positive reactance value ΔLm of the high-pass structure at the higher frequency f2. Similarly, in the combined structure, the bridge individual elements 38 and 41 in FIGS. 20 and 25 are in each case replaced by a series resonant circuit 38, 41 that has the negative bridge reactance value ΔCb of the low-pass structure at the low frequency f1 and correspondingly has the positive reactance value ΔLb of the high-pass structure at the higher frequency f2. With such a decoupling network 3, a frequency progression of the decoupling can be achieved similarly to as shown in FIG. 23.

DETAILED DESCRIPTION

Further advantages of the invention will be described in detail in the following:

A particular advantage of an antenna system 1 having a network 3 in accordance with the invention comprises the possibility of connecting each of two individual antennas 1a, 1b, which are radiation coupled as a result of their small spacing from one another, to a transmission-reception device via a coupled electrical line 15 that avoids the mutual interferences in the transmission-reception devices 16a, 16b caused by the coupling and that can be individually designed with a particularly low economic effort. Furthermore, the coupled line is capable of simultaneously achieving a decoupling and an impedance matching to the standardized resistance Z0=1/Y0. In common technology, this usually amounts to Z0=50 Ohm.

There is in particular the advantageous possibility of arranging the antennas 1a, 1b together with the coupled electrical line as a decoupling network 3 on a common mechanical carrier. Due to the direct mechanical connection of the antennas to a coupled electrical line 15 designed on an electrical circuit board as a mechanical carrier, particular space savings are made possible that are often decisive in motor vehicle construction.

The arrangement in FIGS. 4 and 7 in accordance with the invention composed solely of a coupled electrical line 15 designed in accordance with the invention as a decoupling network 3 can be implemented individually and economically with a very low effort and can be flexibly adapted to the antenna system 1—in accordance with the specified dimensionings. The decoupling shown in FIGS. 8a, 8b is thus achieved. In this respect, it is particularly advantageous to design the coupled electrical line 15 as a microstrip line 26 on the circuit board, as shown by way of example in FIG. 18a.

Figure 17A:
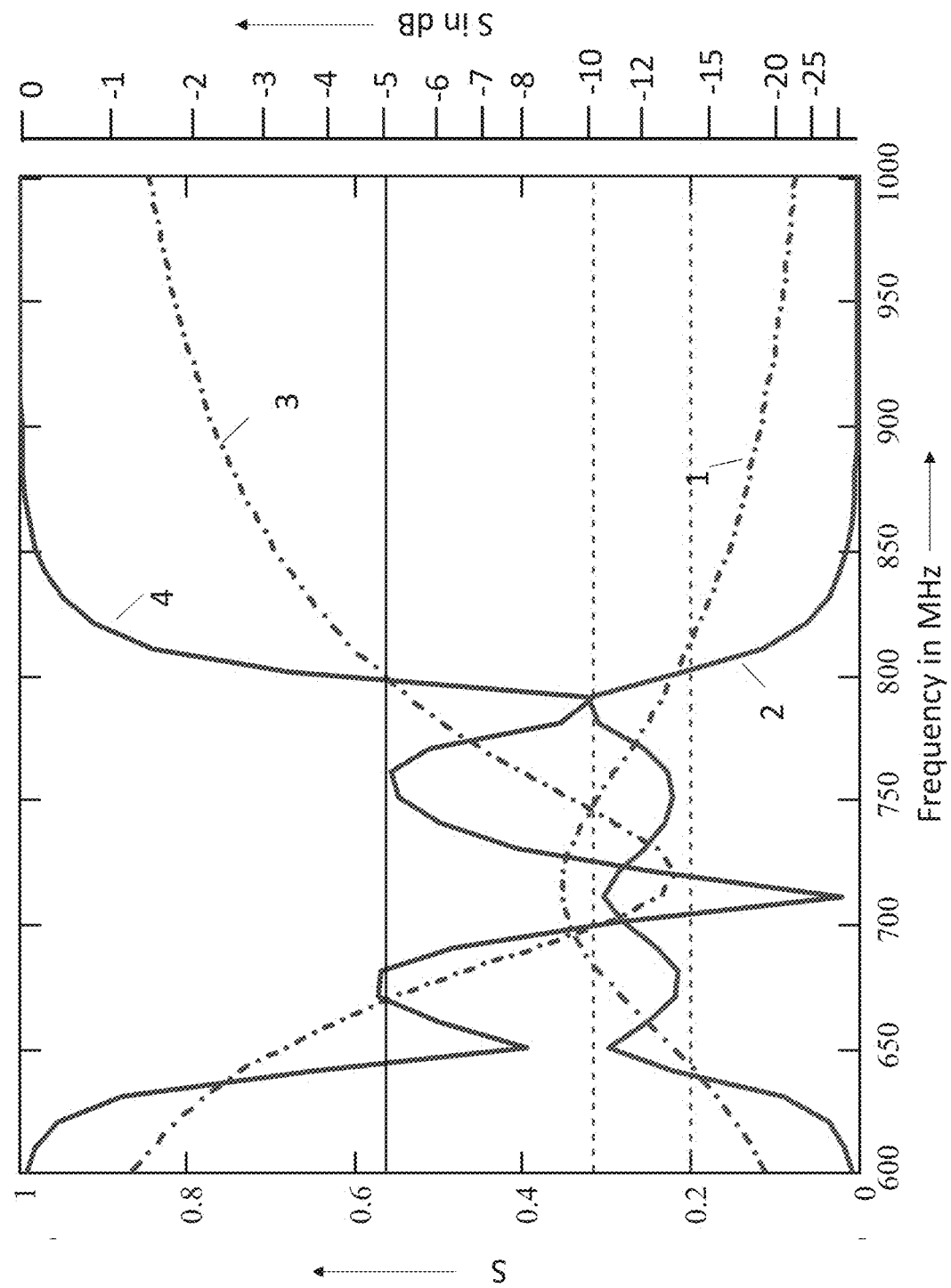
Figure 17B:
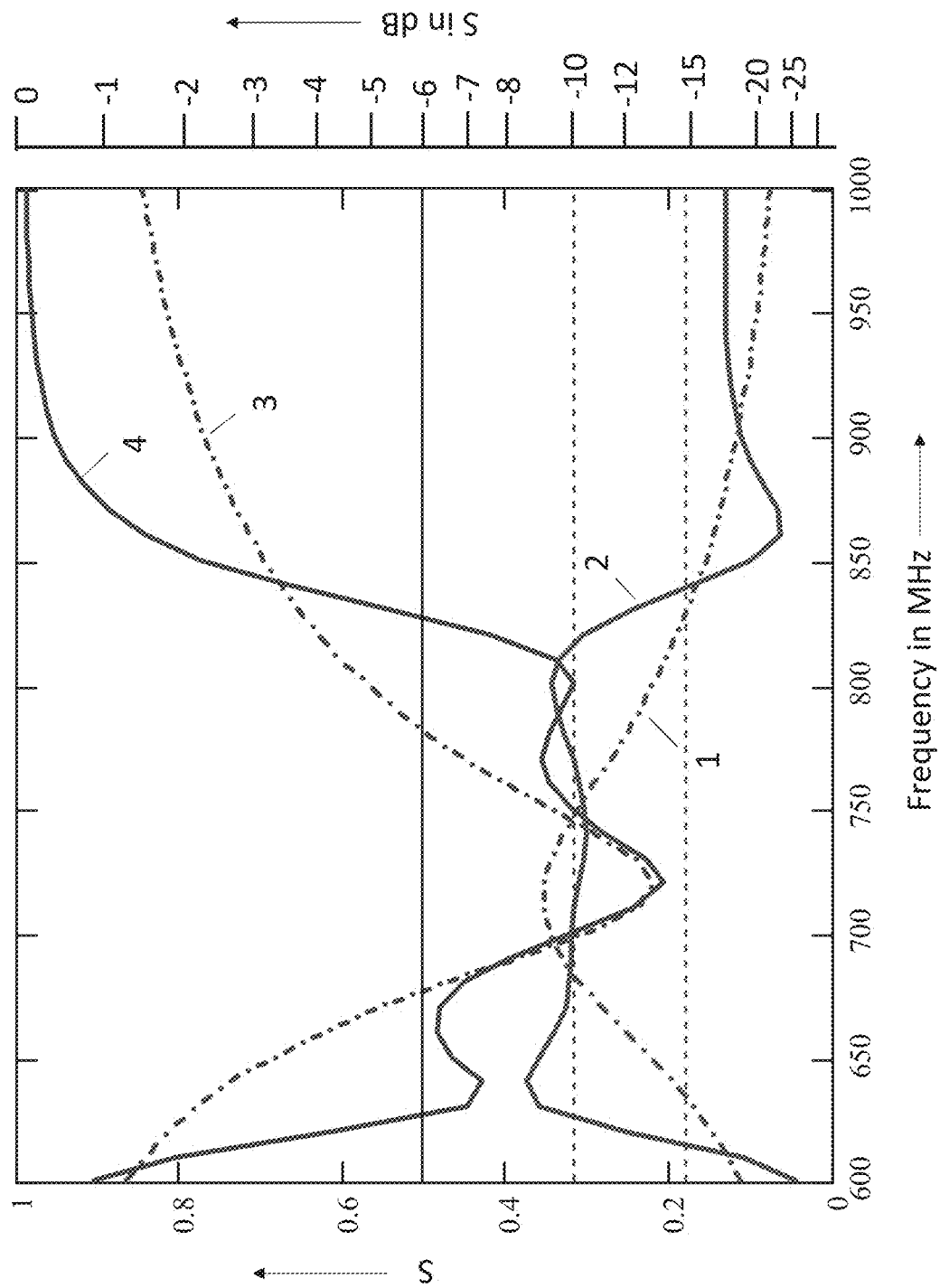

With only a few electrical components, the arrangement in FIG. 7 can be supplemented with an antenna matching network 24a, 24b and an output matching network 25a, 25b—as shown in FIG. 16a—and the broadband and often sufficient decoupling in accordance with FIG. 17a, 17b can be established over a larger frequency range. The establishing of the coupled electrical line 15 takes place in accordance with the above-mentioned dimensionings for the line wave impedances ZLp and Zln and for the electrical angles αp and αn that result from the mathematical relationships indicated above from the antenna impedances ZAp=1/YAp and ZAn=1/YAn. The conversion into the geometric structure of the coupled electrical line 15 as a microstrip line 26 expediently takes place using a simulation model. Said simulation model can for this purpose be expediently divided in cross-section along its plane of symmetry into two halves that each include only one line. This takes place in the case of the symmetrical line 13 by terminating the plane of symmetry with a magnetic wall in accordance with FIG. 18b and in the case of the antisymmetrical line by terminating the plane of symmetry with an electrical wall as in FIG. 18c. The conductor width 11 and the half conductor spacing 11 can then be varied for a given substrate height 19 and for a predefined dielectric until the desired line wave impedance ZLp and the phase constant Pp are present for the cross-section at the left and the desired line wave impedance ZLn and the phase constant Pln are present for the cross-section at the right. In addition, the mutually oppositely disposed margins of the strip conductors can e.g. engage into one another in a tooth-like manner at a spacing, whereby ZLp with Pp and ZLn with Pln can better be set separately. For the simulation, professional high-performance digital computer programs are, for example, available in accordance with the finite element method that enable the targeted determination of suitable printed conductor structures for a coupled electrical line 15 in microstrip line technology with the required parameters.

A comparison of the representation of a coupled line 15 as a microstrip line 26 with the electrical lines 15 coupled in FIGS. 18d and 18e illustrates the advantageously simple and flexible designability of the microstrip line 26 in contrast to an implementation as a two-wire line above a conductive plane or as a two-wire line having a circular shielding.

The symmetrical impedances (Z . . . ) or impedances (Y . . . ) marked with the suffix p and the antisymmetrical impedances (Z . . . ) or impedances (Y . . . ) marked with the suffix n—which correspond reciprocally to one another in each case—present at the gate 2b in FIGS. 5a to 5d and thus also at the antenna connection gate 2a are defined in the following:

Fig. a) $U/I=ZAp=Z11A+Z12A$; related to Z0, it
applies: $zAp=rAp+j*xAp=ZAp/Z0$

Fig. b) $U/I=ZAn=Z11A-Z12A$; related to Z0, it
applies: $zAn=rAn+j*xAn=ZAn/Z0$

Fig. c) $I/U=YAp=Y11A+Y12A$; related to Y0, it
applies:

$yAp=gAp+j*bAp=YAp/Y0$

Fig. d) $I/U=YAn=Y11A-Y12A$; related to Y0, it
applies:

$yAn=gAn+j*bAn=YAn/Y0$ (10)

The output gates of the antenna matching network 24a, 24b are designated by 2a' and 2b'. Accordingly, the above relationships for the impedances or admittances to be marked with an apostrophe apply for the description of the two-pole circuit or four-pole circuit present between the gates 2a' and 2b'.

In complete correspondence to FIGS. 5a to 5d, the electrical characteristics are detected as four-pole circuits at the output of the network 3 between the antenna connection gates 4a and 4b with the impedances or admittances. Analogously to these Figures, the following in each case applies between the outputs of the network 3:

Fig. a) $U/I=ZNp=Z11N+Z12N$; related to Z0, it
applies: $zNp=rNp+j*xNp=ZNp/Z0$

Fig. b) $U/I=ZNn=Z11N-Z12N$; related to Z0, it
applies: $zNn=rNn+j*xNn=ZNn/Z0$

Fig. c) $I/U=YNp=Y11N+Y12N$; related to Y0, it
applies: $yNp=gNp+j*bNp=YNp/Y0$

Fig. d) $I/U=YNn=Y11N-Y12N$; related to Y0, it
applies: $yAn=gNn+j*bNn=YNn/Y0$ (11)

Based on the definitions provided here for the impedance or admittances at the connection gates, the impedance matrix related to the standardized admittance Z0 or the admittance matrix related to Y0 for the antenna connection gates 2a, 2b reads as follows:

$$zAM = \frac{1}{2} * \begin{bmatrix} zAp + zAn & zAp - zAn \\ zAp - zAn & zAp + zAn \end{bmatrix} \quad (12)$$

or $$yAM = \frac{1}{2} * \begin{bmatrix} yAp + yAn & yAp - yAn \\ yAp - yAn & yAp + yAn \end{bmatrix}$$

In correspondence thereto, the related impedance matrix zNM or the admittance matrix yNM at the decoupling network connection gates 4a, 4b reads as follows:

$$zNM = \frac{1}{2} * \begin{bmatrix} zNp + zNn & zNp - zNn \\ zNp - zNn & zNp + zNn \end{bmatrix} \quad (13)$$

or $$yNM = \frac{1}{2} * \begin{bmatrix} yNp + yNn & yNp - yNn \\ yNp - yNn & yNp + yNn \end{bmatrix}$$

where it applies: $yAM=zAM^{-1}$ and $yAN=zAN^{-1}$

Based on the symmetrical and asymmetrical impedances or admittances, the coupling between the two antenna connection gates 2a and 2b or between the two decoupling network connection gates 4a and 4b can therefrom in each case be represented as the scattering parameter $S2a2b$ or $S4a4b$ on the termination of a respective one of the gates with the standard resistance $Z0=1/Y0$ in accordance with the following relationships:

$$S2a2b = \frac{yAn - yAp}{1 + yAp + yAn + yAp*yAn;} = \frac{zAp - zAn}{1 + zAp + zAn + zAp*zAn;} \quad (14)$$

where $S2a2b_{dB} = 20 * \log(|S2a2b|)$ $$S4a4b = \frac{yNn - yNp}{1 + yNp + yNn + yNp*yAN;} = \frac{zNp - zNn}{1 + zNp + zNn + zNp*zNn;}$$

where $S4a4b_{dB} = 20 * \log(|S4a4b|)$

A complete decoupling, i.e. a low decoupling, is achieved between the decoupling network connection gates 4a and 4b at the frequency f1 when the difference between the symmetrical impedance or admittance marked with the suffix "p" and the asymmetrical impedance or admittance marked with the suffix "n" disappears at this frequency, i.e. when yNn=yNp is satisfied in an equivalent manner to zNp=zNn.

As a measure for the impedance matching to the standard resistance Z0 at a connection gate, the reflection factor is considered that is in each case present when the other connection gate is terminated with the standard resistance Z0.

Thus, it applies for the antenna connection gates 2a, 2b:

$$S2a2a = S2b2b = \frac{1 - yAp*yAn}{1 + yAp + yAn + yAp*yAn;} \quad (15)$$

where $$S2a2a_{dB} = S2b2b_{dB} = 20 * \log(|S4a4a|)$$

And it accordingly applies for the decoupling network connection gates 4a, 4b:

$$S4a4a = S4b4b = \frac{1 - yNp * yNn}{1 + yNp + yNn + yNp * yNn;} \text{ where } S4a4a_{dB} = \quad (16)$$

$$S4b4b_{dB} = 20 * \log(|S4a4a|)$$

Thus, it is shown that the reflection S4$a$4$a$=S4$b$4$b$ at the decoupling network connection gates 4$a$, 4$b$ disappears when the symmetrical impedance or admittance marked with the suffix "p" and the asymmetrical impedance or admittance marked with the suffix "n" are equal at this frequency, i.e. yNn=yNp is satisfied in an equivalent manner to zNp=zNn.

In accordance with the invention, the coupled electrical line 15 in the economically particularly advantageous basic form of the invention in FIGS. 4$a$, 4$b$ and in FIG. 7 thus provides the low decoupling at the frequency f1—that is the complete decoupling between the network connection gates 4$a$, 4$b$—and furthermore also transforms the impedances present at the antenna connection gates 2$a$, 2$b$ such that, at each of the decoupling network connection gates 4$a$, 4$b$, an impedance matching to Z0=1/Y0 is given when the other connection gate is terminated with Z0 in each case. In accordance with the invention, this is achieved in that the geometry and the embodiment of the coupled electrical line 15 are designed such that both the line wave admittance yLp=YLp/Y0, related to Y0, of the symmetrical electrical line 13 and the electrical angle αp of said symmetrical electrical line 13 and the corresponding line wave admittance yLn=YLn/Y0, related to Y0, of the antisymmetrical electrical line 14 and the electrical angle αn of said antisymmetrical electrical line 14 are formed in accordance with the following relationships that are predefined by the admittances YAp/Y0 and YAn/Y0, related to Y0, of the antenna system 1, wherein the following requirements apply:

$$YLp/Y0 = yLp = \sqrt{\frac{|yAp|^2 - gAp}{gAp - 1}}; \quad \alpha p = \arctan\left(\frac{1 - gAp}{bAp} \cdot yLp\right)$$

$$\frac{YLn}{Y0} = yLn = \sqrt{\frac{|yAn|^2 - gAn}{gAn - 1}}; \quad \alpha n = \arctan\left(\frac{1 - gAn}{bAn} \cdot yLn\right)$$

and the following specifications apply:

$$yAp = \frac{YAp}{Y0} = gAp + j*bAp; \text{ and } yAn = \frac{YAn}{Y0} = gAn + j*An;$$

where: $j^2 = -1$

To design a coupled electrical line 15 with the values required in accordance with the invention for YLp, YLn and with the required electrical angles αp and αn, it is advantageous to first determine, independently of the line length l 10, the electrical structure of the coupled electrical line 15, which provides values for YLp, YLn and for the phase constants βp and βn such that their ratio βp/βn=αp/αn is satisfied, and to select the geometric line length l 10 in accordance with l=αp/βp, equivalent to αn/βn for the frequency f1.

As a guide to achieving this goal, Ylp, YLn and βp/βn are to be designed from the distributed capacitances and inductances as follows in accordance with the relationships indicated above:

$$\beta p/\beta n = \sqrt{\frac{Lp}{Ln} * \frac{Cm`}{(Cm` + 2*Cb`)}} \quad YLp = \frac{1}{ZLp} = \sqrt{\frac{Cm`}{Lp`}}, \quad (17)$$

$$YLn = \frac{1}{ZLn} = \sqrt{\frac{Cm` + 2*Cb`}{Ln`}}$$

Figure 8:
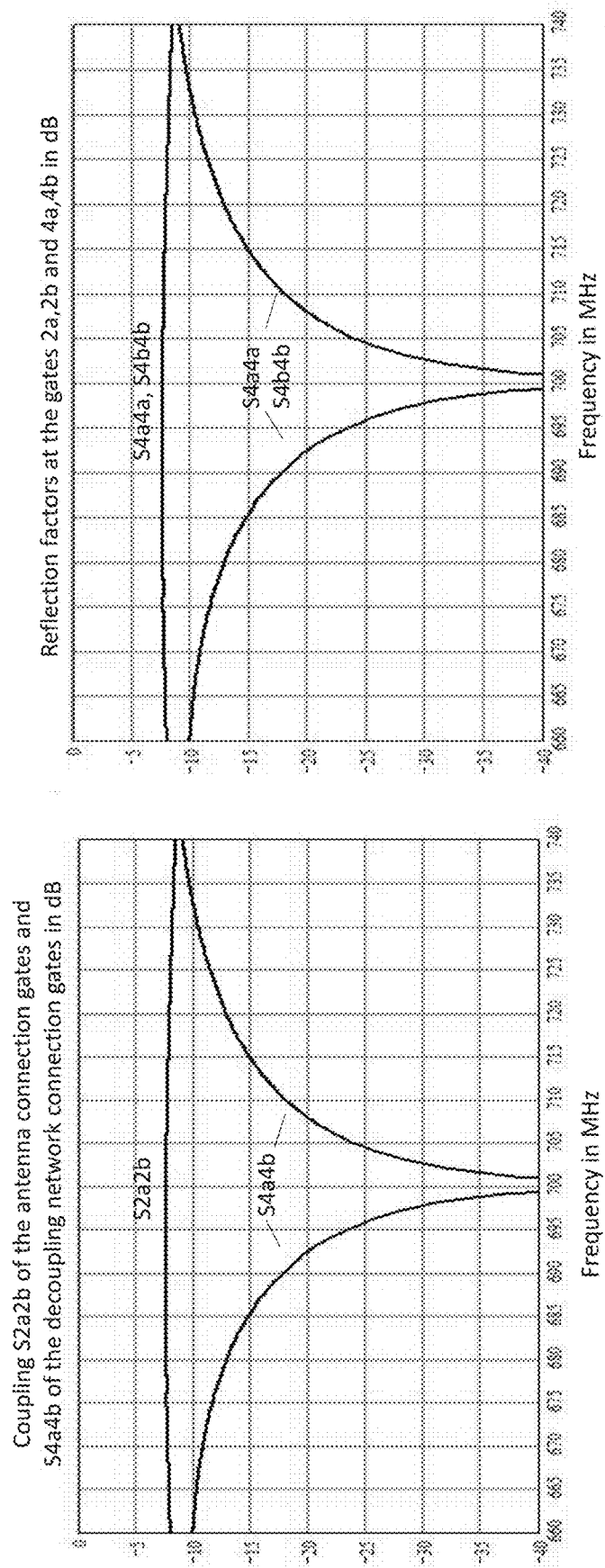

The decoupling of the antenna connection gates 4$a$, 4$b$ and the reflection attenuation are shown in FIGS. 8$a$ and 8$b$ and have already been discussed above in connection with these Figures.

For the special case in which the dimensioning of the coupled electrical line 15 is difficult due to particular symmetrical and antisymmetrical antenna impedances ZAp and ZAn of the antenna system 1 at the frequency f1 or leads to unwieldy dimensions, the transformation of the antenna impedances ZAp and ZAn by the coupled electrical line 15 at its end into two mutually equal admittances YNp=YNn takes place in an advantageous embodiment of the invention in FIG. 9$a$, whereby a decoupling of the two network connection gates 4$a$, 4$b$ at the end of the coupled line 15 is achieved in FIG. 9$a$.

To achieve the same predefined admittance $$\frac{YNp}{Y0} = \frac{YNn}{Y0} = \frac{YN}{Y0} = yN = gN + j \cdot bN$$

related to Y0 at the frequency f1, for the symmetrical line 13, the line wave admittance $$\frac{YLp}{Y0}$$

related to Y0 in accordance with $$YLp/Y0 = yLp = \sqrt{\frac{gN \cdot |yAp|^2 - gAp \cdot |yN|^2}{gAp - gN}}$$

and the electrical angle in degrees in accordance with $$ap = 180/\pi \cdot \arctan\left(\frac{gN - gAp}{gN \cdot bAp + bN \cdot gAp} \cdot yLp\right)$$

are to be selected and, for the antisymmetrical line 14, the line wave admittance related to Y0 in accordance with $$YLn/Y0 = yLn = \sqrt{\frac{gN \cdot |yAn|^2 - gAn \cdot |yN|^2}{gAn - gN}}$$

and the electrical angle in degrees in accordance with $$\alpha n = 180/\pi \cdot \arctan\left(\frac{gN - gAn}{gN \cdot bAn + bN \cdot gAn} \cdot yLn\right)$$

are to be set.

For an admittance matching to the standardized admittance Y0 at the decoupling network connection gates 4$a$, 4$b$ for the frequency f1, in FIG. 9b a mutually identical output matching network 25a, 25b for transforming the admittance, which is in each case present at both ends of the coupled electrical line 15, into the standardized admittance Y0 is inserted between each of the two mutually decoupled ends of the coupled electrical line 15—the line connection gates 4a2, 4b'—and the corresponding decoupling network connection gate 4a, 4b.

For the special case that the antenna system 1 has real admittances YAp=GAp and YAn=GAn at the antenna connection gates 2a, 2b at the frequency f1 as in FIG. 7, the decoupling $S_{4a4b}$ and the admittance matching ($S_{4a4a}=0$, $S_{4b4b}=0$) of the two output connection gates 4a, 4b to the reference conductance Y0 are established in that both the electrical angle $\alpha p = 2\pi*l/\lambda p$ of the symmetrical line 13 and the electrical angle $\alpha n = 2\pi*l/\lambda n$ of the antisymmetrical line 14 each amount to $\alpha p = \alpha n = 90°$ and the line wave conductance of the symmetrical line 13 $YLp=\sqrt{GAp*Y0}$ and the line wave conductance of the antisymmetrical line 14 $YLn=\sqrt{GAn*Y0}$ are selected.

The wavelengths of the symmetrical and the asymmetrical waves are described by $\lambda p$ and $\lambda n$.

In general, this special case YAp=GAp and YAn=GAn as in FIG. 7 is not given. In this case, provision is made in accordance with the invention in accordance with FIG. 10 that, between each of the two antenna connection gates 4a, 4b and the connection to the corresponding conductor 8a, 8b of the coupled electrical line 15, a mutually identical antenna matching network 24a, 24b, having the output gates 2a'or 2B', is to be connected by which the antenna admittances YAp and YAn respectively, which are present at the antenna connection gates 2a, 2b, are transformed at the frequency f1 into a real admittance GAp or GAn in each case. As already described above, the coupled electrical line 15 is designed such that the line wave admittance of the symmetrical electrical line 13 amounts to $YLp=\sqrt{GAp*Y0}$ and the electrical angle of said symmetrical electrical line 13 amounts to $$\alpha p = \frac{l}{\lambda p} * 360 = 90°$$

and the line wave admittance of the antisymmetrical electrical line 14 amounts to $YLn=\sqrt{GAn*Y0}$ and the electrical angle of said antisymmetrical electrical line 14 amounts to $$\alpha n = \frac{l}{\lambda n} * 360 = 90°.$$

To achieve the real admittances GAp and GAn, each antenna matching network 24a, 24b is formed, as shown in FIGS. 11b and 11c, from a parallel two-terminal circuit 28, 30, connected in parallel with the antenna connection gate 2a, 2b and having a reactance Bp from at least one dummy element, and a series two-terminal 29, 31, connected in series and having a susceptance Xs from at least one dummy element, wherein Bp/Y0 and Xs/Z0 respectively have the following values at the frequency f1 in order to satisfy the requirement YAp=GAp or YAn=GAn, with the two solutions shown in FIG. 11b or 11c from the following relationships:

$$bp = Bp/Y0 = \frac{|zAn|^2 - |zAp|^2}{2*(xAp*|zAn|^2 - xAn*|zAp|^2)} * \left[ \right.$$

-continued $$\left. 1 \pm \sqrt{1 - \frac{4(xAp*|zAn|^2 - xAn*|zAp|^2)*(xAn - xAp)}{(|zAp|^2 - |zAn|^2)^2}} \right]$$

and $$xs = Xs/Z0 = \frac{|zAn|^2 - |zAp|^2}{2*(xAp*|zAn|^2 - xAn*|zAp|^2)}$$

where $$zAp = rAp + j \cdot xAp = \frac{ZAp}{Z0} = \frac{Y0}{YAp} \text{ and } zAn = rAn + j \cdot xAn = \frac{ZAn}{Z0} = \frac{Y0}{YAn}$$

as well as $|zAn|^2 = (rAn)^2 + (xAn)^2$ and $|zAn|^2 = (rAn)^2 + (xAn)^2$

The selection of this combination of a parallel two-pole circuit Bp and a series two-pole circuit Xs in accordance with one of the indicated dimensionings for the frequency f1 causes, in the complex reflection factor plane in FIG. 12, the transformation of the impedance point Zp into the real resistance RAp and likewise the transformation of the impedance point Zn into the real resistance RAn so that, at the frequency f1, the complete decoupling between the decoupling network connection gates 4a, 4b takes place via the quarter-wave transformation of the symmetrical electrical line 13 or of the antisymmetrical electrical line 14 of the coupled electrical line 15. As a measure for the decoupling between the decoupling network connection gates 4a, 4b, FIGS. 13a and 13b show the frequency dependence of the scattering parameter S4a4b in dB, already described above in connection with FIG. 14, compared to the scattering parameter S2a2b of the antenna system 1. Analogously thereto, FIGS. 14a and 14b show the scattering parameter S4a4a=S4b4b in dB as a reflection factor at a respective one of the decoupling network connection gates 4a, 4b or at a respective one of the antenna connection gates 2a, 2b—at frequencies around f1=700 MHz—in each case on the termination of the other connection gate with Z0=1/Y0.

In a further development of the invention, it is often advantageous to partly dispense with the low decoupling at the frequency f1 in favor of a decoupling of the connection gates 4a, 4b, which is of a broader band in frequency but is sufficient, and to bring about the greater bandwidth in that the frequency progressions for the antenna impedances ZAp and ZAn in FIG. 12 and in FIG. 16b run at a small spacing from one another after the transformation by the antenna matching networks 24a, 24b and the subsequent transformation via the coupled line 15. This is achieved in accordance with the invention in that, starting from a realization of the antenna connection networks 24a, 24b in accordance with one of the described dimensionings of the two two-terminal circuits from dummy elements in accordance with FIGS. 11a and 11b, said two two-terminal circuits are supplemented in order in each case to form at least one parallel resonant circuit 7a connected in parallel and one series resonant circuit 7b connected in series, as indicated in FIG. 16a.

For an impedance matching of the connection gates 4a, 4b that are sufficiently decoupled from one another in this manner, provision is made in accordance with the invention to design the output matching networks 25a, 25b such that the frequency progressions of the impedances ZNp and ZNn at the decoupling network connection gates 4a, 4b in their progression in the complex impedance plane with an increasing frequency between a lower frequency fu and an upper frequency fo around a center frequency fm wrap around the standardized impedance Z0 at a small spacing, as sketched in FIG. 16c. This output matching is achieved by in each case at least one parallel resonant circuit 7a and one series resonant circuit 7b in the output matching networks 25a, 25b in FIG. 16a. A broadband decoupling that is hereby achieved is shown by the frequency progression of the scattering parameter S4a4b around a center frequency of 750 MHz by way of example in FIG. 17a. The improvement achieved in broadband mode of the decoupling by the decoupling network 3 in accordance with the invention can be seen from the spacing from the curve S4a4b of the scattering parameter S2a2b, shown for comparison, between the antenna connection gates 2a, 2b. The comparison with the frequency progression of the low decoupling, additionally shown in FIG. 17b, in accordance with an arrangement as in FIG. 10 shows the advantage of the decoupling that can be achieved in broadband mode and that in many applications is sufficient for avoiding the mutually caused interferences in the transmission-reception devices 16a, 16b discussed at the start.

The examples shown in FIGS. 1-18 render obvious the application of the teachings of the present invention to mutually identical rod-shaped monopoles 1a, 1b. However, the invention is in no way restricted to this antenna shape. Rather, it applies to all the mutually identical antenna pairs (antenna doublets) that are in a radiation coupling with one another. In this respect, only the radiation coupling in accordance with the scattering parameter S2a2b between the antenna connection gates 2a, 2b is of importance, said scattering parameter S2a2b being independent of the directional radiation coupling of the antenna doublet with an antenna located in the far field—and thus of the directional pattern of the antenna doublet. Thus, the invention is not limited to paired rod-shaped monopoles, but equally covers all the paired, ground-unsymmetrical monopole structures whose monopole connection gate 2a', 2b' with a pole is given by the ground 6. It is a similar case with paired antennas having ground-symmetrical dipole structures, each having a ground-symmetrical connection gate 2a, 2b'. To maintain the symmetry of the arrangement, a respective re-balancing arrangement 34 is connected downstream in the transition to the associated ground-unsymmetrical connection gate 2a, 2b. Thus, the invention is also not limited to paired, rod-shaped dipoles, but equally covers all the paired, ground-symmetrical dipole structures whose dipole connection gate 2a', 2b' is in each case designed by ground-symmetrical connections.

FIG. 19a shows an arrangement in which each of the mutually identical antennas 1a, 1b is formed as a monopole antenna 1a, 1b connected to ground 6 with one of its nadir terminals 2a', 2b'. To bridge the antenna spacing d with the associated antenna connection gate 2a, 2b, the latter is connected via a respective identical short ground-unsymmetrical line piece 35.

In contrast thereto, in FIG. 19b, each of the mutually identical antennas 1a, 1b is in each case formed as a dipole antenna 1a', 1b' designed symmetrical to ground 6. Each ground-symmetrical connection gate 2a, 2b' is in each case connected to the associated antenna connection gate 2a, 2b via a respective identical re-balancing arrangement 34 having a short ground-symmetrical input line and a ground-unsymmetrical output line for bridging the antenna spacing d and for re-balancing the ground-symmetrical dipole connection gate 2a', 2b' with respect to the ground-unsymmetrical antenna connection gate 2a, 2b.

LIST OF DESIGNATIONS

Antenna system 1
Radiation coupled antennas 1a, 1b
Antenna connection gate 2a, 2b
Antenna matching network connection gate 2a', 2b'
Network 3
Network connection gate 4a, 4b
Line connection gates 4a2, 4b'
Antenna path 5a, 5b
Common ground 6
Parallel resonant circuit, series resonant circuit 7a, 7b
Linear electrical conductor 8a, 8b
Ground fault 9
Common length l 10
Conductor spacing 11
Ground spacing 12
Symmetrical electrical line 13 (excited in the same sense)
Antisymmetrical electrical line 14 (excited in the opposite sense)
Coupled line 15
Transmission-reception device 16
Strip conductor 17
Conductor spacing 18
Ground spacing 19
Ground plane 20
Coupling inductance M 21,
Live connection point 22a,22b
Conductor diameter 23
Antenna matching networks 24a, 24b
Output matching network 25a, 25b
Conductor width 26
Permittive substrate 27
Positive parallel susceptance 28
Positive series reactance 29
Negative parallel susceptance 30
Negative series reactance 31
Microstrip line 32
Round conductor 33
Re-balancing arrangement 34
Ground-unsymmetrical line piece 35
Discrete inductive component of the inductance $\Delta Lp$, $\Delta Ls$ 36
Discrete capacitive component having the ground capacitance $\Delta Cm$ 37
Discrete capacitive component having the bridge capacitance $\Delta Cb$ 38
Live connection point 39a, 39b
Discrete inductive component having the ground inductance $\Delta Lm$ 40
Discrete inductive component having the bridge inductance $\Delta Lb$ 41
Discrete capacitive component having the series capacitance $\Delta Cs$ 42
Discrete two-pole series dummy circuit; inductive at f1 43
Discrete two-pole ground dummy circuit; capacitive at f1, f2 44, 44'
Discrete two-pole bridge dummy circuit; capacitive at f1, f2 45
Isolating series resonant circuit 46
Isolating parallel resonant circuit 47
Antenna admittance $YAp=GGp+j*BAp$ and $YAn=Gan+j*Ban$   $YAp/Y0=yAp=gAp+j*bAp$ and $YAn=yAn=gAn+j*bAn$
Standardized real reference resistance $Z0=1/Y0$
Antenna spacing d
Coupling: Antenna connection gates, scattering parameter S2a2b_dB
Coupling: Decoupling network connection gates, scattering parameter S4a4b_dB Reflection factor: Antenna connection gates, scattering parameters S2$a$2$a$_dB, S2$b$2$b$_dB
Reflection factor: Decoupling network connection gates, scattering parameters S4$a$4$a$_dB, S4$b$4$b$_dB
Susceptance to ground Bp
Infinitesimal series inductances dLp, dLn
Infinitesimal ground capacitance dCm
Infinitesimal bridge capacitance dCb
Distributed capacitance to ground Cm'=dCm/dl
Distributed capacitance of the conductors with respect to one another Cb'=dCb/dl
Symmetrical line wave conductance YLp=1/ZLp
Antisymmetrical line wave conductance YLn=1/ZLn
Symmetrical line phase constant $$\frac{d\alpha p}{dl} = \beta p$$

Antisymmetrical line phase constant $$\frac{d\alpha n}{dl} = \beta n$$

Free space wavelength λ0
Symmetrical wavelength λp
Antisymmetrical wavelength λn
Electrical angle αp
Electrical angle αn

The invention claimed is:

1. An antenna system comprising two identical mutually radiation coupled antennas arranged symmetrically with respect to one another, said antennas having a respective antenna connection gate and a network, which is connected at the input side to the antenna connection gates and which is formed from dummy elements, and having a respective antenna path to a network connection gate, said antenna paths being identical to one another and being separately associated with an antenna, the antenna system comprising the following features:
  each antenna connection gate in each case consists of a connection point live to ground and a ground connection point that is connected to a common ground for all the connection gates;
  each live connection point of an antenna connection gate is in each case connected to the live connection point of the corresponding network connection gate of an antenna path by a linear electrical conductor;
  a planar ground plane is present at least along two linear electrical conductors, said ground plane being spaced from the linear electrical conductors at a distance;
  the two linear, mutually identical electrical conductors are guided at least over a common length l both, with a spacing in parallel with one another and the distance over and in parallel with the ground plane, so that, due to the two linear electrical conductors, in each case both a symmetrical electrical line related to the ground is formed and, between the two linear electrical conductors, an antisymmetrical electrical line related to one another is formed thereby forming a coupled electrical line; and
  a wave impedance ZLp that is present upon an excitation of the coupled electrical line in same directions and the electrical angle αp, as well as the wave impedance ZLn and the electrical angle αn present on an excitation of the coupled electrical line in opposite directions are designed such that, at least one frequency f1, the coupling present between the network connection gates is substantially smaller, due to the use of the network, than the coupling present between the corresponding antenna connection gates.

2. The antenna system of claim 1, wherein,
to design the cooperation with the coupled electrical line,
  the admittance YAp=GAp+jBAp at one of the antenna connection gates, which admittance is present on the excitation of said one antenna connection gate with a measurement signal and on a simultaneous excitation of the other antenna connection gate with the same measurement signal polarized in the same sense, and
  the admittance YAn=GAn+jBAn at one of the antenna connection gates, which admittance is present on the excitation of said one antenna connection gate with a measurement signal and on a simultaneous excitation of the other antenna connection gate with the same but oppositely polarized measurement signal, are detected by the antenna system.

3. The antenna system of claim 2, wherein,
to design the cooperation in the antenna system, the electrical properties of the coupled electrical line, which is released at its one end from the antenna connection gates and which has the geometric length l, are detected and set based on the following susceptances present at the other end of the coupled electrical line, i.e. at the network connection gates,
on the one hand, in the case of a short-circuit of both conductors with ground at the one end,
—these are—
  susceptance Bkp at one of the network connection gates on its excitation with a measurement signal and on a simultaneous excitation of the other network connection gate with the same measurement signal polarized in the same sense,
  susceptance Bkn at one of the network connection gates on its excitation with a measurement signal and on a simultaneous excitation of the other network connection gate with the same but oppositely polarized measurement signal,
and, on the other hand, based on the following susceptances that are detected and set in an open-circuit operation of both conductors at the one end of the coupled electrical line
—these are:—
  susceptance Blp at one of the network connection gates with the same measurement signal polarized in the same sense;
  susceptance Bln at one of the network connection gates on its excitation with a measurement signal and on a simultaneous excitation of the other network connection gate with the same but oppositely polarized measurement signal;
and, from this, the real line wave admittance YLp of the electrical line excited in the same sense and the electrical angle αp of said electrical line as well as the real line wave admittance YLn of the electrical line excited in the opposite sense and the electrical angles αp and αn of said electrical line are separately determined and set based on the following relationships:

$YLp=\sqrt{-Bkp*Blp}$ and $YLn=\sqrt{-Bkn*Bln}$ $\alpha p=\arctan(\sqrt{-Blp/Bkp})$; $\alpha n=\arctan(\sqrt{-Bln/Bkn})$ 4. The antenna system of claim 1, characterized in that, at both network connection gates at the at least one frequency f1, there is an impedance matching to the real resistance Z0=1/Y0 standardized in technology in that the structure and the length l of the coupled electrical line are designed such that both the line wave admittance yLp=YLp/Y0, related to Y0, of the symmetrical electrical line and the electrical angle αp of said symmetrical electrical line and the corresponding line wave admittance yLn=YLn/Y0, related to Y0, of the antisymmetrical electrical line and the electrical angle αn of said antisymmetrical electrical line are formed in accordance with the following relationships, which are predefined by the admittances YAp/Y0 and YAn/Y0, related to Y0, of the antenna system at the antenna connection gates, wherein it applies:

$$yAp = \frac{YAp}{Y0} = gAp + j*bAp; \text{ and } yAn = \frac{YAn}{Y0} = gAn + j*bAn;$$

$$YLp/Y0 = yLp = \sqrt{\frac{|yAp|^2 - gAp}{gAp - 1}}; \alpha p = \arctan\left(\frac{1 - gAp}{bAp} \cdot yLp\right)$$

$$YLn/Y0 = yLn = \sqrt{\frac{|yAn|^2 - gAn}{gAn - 1}}; \alpha n = \arctan\left(\frac{1 - gAn}{bAn} \cdot yLn\right)$$

where: $j^2 = -1$.

5. The antenna system of claim 1, wherein the antenna system has real admittances GAp and GAn at the antenna connection gates at the at least one frequency f1 so that YAp=GAp and YAn=GAn applies and the decoupling of the two network connection gates 4a, 4b and the admittance matching of the two network connection gates 4a, 4b to the reference conductance Y0 are established in that both the electrical angle αp=2π*l/λp of the symmetrical line and the electrical angle αn=2π*l/λn of the antisymmetrical line each amount to αp=αn=90° and the line wave conductance of the symmetrical line YLp=√(GAp*Y0) and the line wave conductance of the antisymmetrical line YLn=√(GAn*Y0) are selected, wherein λp and λn describe the wavelengths of the symmetrical and the antisymmetrical waves and are set as equal.

6. The antenna system of claim 1, wherein,
at the at least one frequency f1 at a respective one of the two network connection gates, both on an excitation in the same sense and on an excitation in the opposite sense at the respective other network connection gate, the same predefined admittance $$\frac{YNp}{Y0} = \frac{YNn}{Y0} = \frac{YN}{Y0} = yN = gN + j \cdot bN$$

related to Y0 is given in that, for the symmetrical line, the line wave admittance $$\frac{YLp}{Y0}$$

related to Y0 in accordance with:

$$YLp/Y0 = yLp = \sqrt{\frac{gN \cdot |yAp|^2 - gAp \cdot |yN|^2}{gAp - gN}}$$

and the electrical angle in degrees in accordance with:

$$\alpha p = 180/\pi \cdot \arctan\left(\frac{gN - gAp}{gN \cdot bAp + bN \cdot gAp} \cdot yLp\right)$$

are selected and, for the antisymmetrical line, the line wave admittance YLn related to Y0 in accordance with:

$$YLn/Y0 = yLn = \sqrt{\frac{gN \cdot |yAn|^2 - gAn \cdot |yN|^2}{gAn - gN}}$$

and the electrical angle in accordance with:

$$\alpha n = 180/\pi \cdot \arctan\left(\frac{gN - gAn}{gN \cdot bAn + bN \cdot gAn} \cdot yLn\right)$$

are selected, whereby a decoupling of the two network connection gates at the end of the coupled line is achieved.

7. The antenna system of claim 6, wherein,
to achieve the impedance matching of the network connection gates to the standardized admittance Y0 for the at least one frequency f1, a mutually identical output matching network for transforming the admittance, which is in each case present at the line connection gates of the coupled electrical line, into the standardized admittance Y0 is inserted between each of the two mutually decoupled ends of the coupled electrical line—the line connection gates—and the corresponding decoupling network connection gate.

8. The antenna system of claim 6, wherein,
between each of the two antenna connection gates and the connection to the corresponding conductor of the coupled electrical line, a mutually identical antenna matching network is connected by which the antenna admittances YAp and YAn respectively, which are present at the two connection gates, are transformed at the at least one frequency f1 into a real admittance GAp or GAn in each case and the coupled electrical line is designed such that the line wave admittance of the symmetrical electrical line amounts to YLp=√(GAp*Y0) and the electrical angle of said symmetrical electrical line amounts to:

$$\alpha p = \frac{l}{\lambda p} * 360 = 90°$$

and the line wave admittance of the antisymmetrical electrical line amounts to:

$$YLn = \sqrt{GAn*Y0}$$

and the electrical angle of said antisymmetrical electrical line amounts to:

$$\alpha n = \frac{l}{\lambda n} * 360 = 90°.$$

9. The antenna system of claim 8, wherein the antenna system has real admittances GAp and GAn at the antenna connection gates at the at least one frequency f1 so that YAp=GAp and YAn=GAn applies and the decoupling of the two network connection gates 4a, 4b and the admittance matching of the two network connection gates 4a, 4b to the reference conductance Y0 are established in that both the electrical angle $\alpha p=2\pi*l/\lambda p$ of the symmetrical line and the electrical angle $\alpha n=2\pi*l/\lambda n$ of the antisymmetrical line each amount to $\alpha p=\alpha n=90°$ and the line wave conductance of the symmetrical line $YLp=\sqrt{GAp*Y0}$ and the line wave conductance of the antisymmetrical line $YLn=\sqrt{GAn*Y0}$ are selected, wherein $\lambda p$ and $\lambda n$ describe the wavelengths of the symmetrical and the antisymmetrical waves and are set as equal and wherein, to achieve the real admittances GAp and GAn, each antenna matching network is formed from a parallel two-terminal circuit, connected in parallel with the antenna connection gate and having a susceptance Bp from at least one dummy element, and a series two-terminal circuit connected in series and having a reactance Xs from at least one dummy element, wherein Bp/Y0 and Xs/Z0 respectively have the following alternative values at the at least one frequency f1 in order to satisfy the requirement:

$$YAp=GAp \text{ or } YAn=GAn$$

$$bp = Bp/Y0 = \frac{|zAn|^2 - |zAp|^2}{2*(xAp*|zAn|^2 - xAn*|zAp|^2)} *$$

$$\left[1 \pm \sqrt{1 - \frac{4\cdot(xAp*|zAn|^2 - xAn*|zAp|^2)*(xAn-xAp)}{(|zAp|^2 - |zAn|^2)^2}}\right]$$

and $$xs = Xs/Z0 = \frac{|zAn|^2 - |zAp|^2}{2*(xAp*|zAn|^2 - xAn*|zAp|^2)}$$

where it applies:

$$zAp = rAp + j\cdot xAp = \frac{ZAp}{Z0} = \frac{Y0}{YAp} \text{ and}$$

$$zAn = rAn + j\cdot xAn = \frac{ZAn}{Z0} = \frac{Y0}{YAn}.$$

10. The antenna system of claim 9, wherein,
in each antenna matching network, in the first of the alternative combinations, the parallel two-terminal circuit having a susceptance Bp is designed as a capacitive component having a capacitance Cp and the series two-terminal circuit having a reactance Xs is designed as an inductive component having an inductance Ls or, in the second of the alternative combinations, the parallel two-terminal circuit having a susceptance Bp is designed as an inductive component having an inductance Lp and the series two-terminal circuit having a reactance Xs is designed as a capacitive component having a capacitance Cs with an inductance Ls.

11. The antenna system of claim 10, wherein,
to extend the frequency range around the at least one frequency f1 as a center frequency in which both an improvement of the decoupling between the network connection gates and an improved impedance matching to the standard resistance Z0 are achieved in that the parallel two-terminal circuit is designed as a parallel resonant circuit and the series two-terminal circuit is designed as a series resonant circuit in the antenna matching networks.

12. The antenna system of claim 11, wherein,
the antenna matching network is designed such that the frequency-dependent progression of the transformed antenna impedance ZAp=1/YAp or ZAn=1/YAn in the complex impedance plane with an increasing frequency at least partly wraps around the real resistance value RAp=1/GAp or RAn=1/GAn with a small deviation in each case and the resistance value RAp or RAn is improved by the transformation with the coupled electrical line into the reference resistance Z0 at the network connection gates as well as the decoupling and the impedance matching over a larger frequency range around the frequency f1.

13. The antenna system claim 12, wherein,
to increase the frequency range with an improved decoupling between the network connection gates around the at least one frequency f1, starting from a realization of the mutually identical antenna connection networks in accordance with a dimensioning of the two two-terminal circuits from dummy elements in claim 9, said two two-terminal circuits are supplemented in order in each case to form a parallel resonant circuit connected in parallel and a series resonant circuit connected in series.

14. The antenna system of claim 13, wherein,
to increase the frequency range around the at least one frequency f1 with an improved decoupling and an improved impedance matching in a frequency range around the frequency f1 at the network connection gates, the output matching network in each case includes at least one parallel resonant circuit and one series resonant circuit that are designed such that both the impedance ZNp and the impedance ZNn at the network connection gates in their progression in the complex impedance plane with an increasing frequency wrap around the standardized impedance Z0 at a small spacing.

15. The antenna system of claim 1, wherein the electrical properties of the coupled electrical line are individually set by the design of the capacitances $Cm'=\Delta Cm/\Delta l$, distributed over the conductor length l, of the individual electrical conductors to ground and $Cb'=\Delta Cb/\Delta l$ of the individual conductors with respect to one another as well as by the distributed inductances $Lp'=\Delta Lp/\Delta l$ for a current flow in the same sense in the two conductors and the distributed inductances $Ln' =\Delta Ln/\Delta l$ for a current flow in an opposite sense in the two conductors such that the required values for the line wave conductance:

$$YLp = \frac{1}{ZLp} = \sqrt{Cm'/Lp'}$$

and for the electrical angle per unit length:

$$\frac{dap}{dl} = \beta p = 2\pi*f1*\sqrt{Lp'*Cm'}$$

of the symmetrical electrical line, and the required values for the line wave conductance:

$$YLn = \frac{1}{ZLn} = \sqrt{(Cm' + 2*Cb')/Ln'}$$

and for the electrical angle per unit length:

$$\frac{d\alpha n}{dl} = \beta n = 2\pi * f1 * \sqrt{(Cm' + 2*Cb')*Ln'}$$

of the antisymmetrical electrical line are reached.

16. The antenna system of claim 1, wherein,
the coupled electrical line is designed as a microstrip line comprising conductor strips on a permittive substrate and the conductor width is selected accordingly, taking into account the permittivity of the substrate for achieving the desired capacitance assignment Cm' and the inductance assignment Lp' to design the line wave admittance YLp and the phase constant βp, and the conductor spacing for designing the capacitance assignment Cb' and—under the effect of the assignment of the coupling inductance M'—the inductance assignment Ln' are selected such that the required line wave admittance YLn and the phase constant Pin are set.

17. The antenna system of claim 1, wherein each of the mutually identical antennas is formed as a monopole antenna that is connected to ground with one of its nadir terminals and that, in order to bridge the antenna spacing d, is connected to the associated antenna connection gate via a respective identical short electrical ground-unsymmetrical line piece.

18. The antenna system of claim 1, wherein each of the mutually identical antennas is in each case formed as a dipole antenna which is designed symmetrical to ground and whose ground-symmetrical connection gate is in each case connected to the associated antenna connection gate via a respective identical re-balancing arrangement having a short ground-symmetrical input line and a ground-unsymmetrical output line for bridging the antenna spacing d and for re-balancing the ground-symmetrical dipole connection gate with respect to the ground-unsymmetrical antenna connection gate.

19. The antenna system of claim 18, wherein,
in the network 3, at least two stages are formed by whose first stage, in the cooperation of the inductive series dummy circuit with the two-pole bridge dummy circuit, the decoupling at the network connection gate for the frequency f1 is also given in that a serial series resonant circuit which is permeable for this frequency f1 is present in the series dummy circuit of the second stage and a serial parallel resonant circuit which is blocking for this frequency f1 is present in the bridge dummy circuit, and the decoupling at the network connection gate at a further frequency f2 is given by a matching in accordance with the invention of the series dummy circuit and the bridge dummy circuit.

20. The antenna system of claim 1, wherein the two linear electromagnetically coupled conductors of the network with their consecutive infinitesimal line pieces of the length dl, consisting of the infinitesimal dummy elements dLp=dLn, dCm, dCb of the symmetrical coupled line 15, are replaced by consecutive circuit stages S1, S2, . . . of a finite number that correspond to the line pieces, but consist of discrete dummy elements, wherein, instead of the infinitesimal dummy elements dLp, dLn, dCm and dCb, discrete components corresponding thereto and having the inductance ΔLp=ΔLs, the bridge capacitance ΔCb and the ground capacitance ΔCm are used and the values of the discrete components are selected such that the decoupling of the network connection gates 4a, 4b is set at a sufficiently lower frequency f1 than the cut-off frequency ftn.

21. The antenna system of claim 20, wherein,
the discrete dummy elements are each replaced by a two-pole discrete dummy circuit such that, at the decoupling frequency f1, it applies in each case:
the dummy circuit used in series instead of the inductance ΔLp, ΔLs is inductive and has the same reactance value as the inductance ΔLp, ΔLs;
the bridge dummy circuit used instead of the bridge capacitance ΔCb is capacitive and has the same reactance value as the bridge capacitance ΔCb (38); and
the ground dummy circuit used instead of the ground capacitance ΔCm is capacitive and has the same reactance value as the ground capacitance ΔCm.

22. The antenna system of claim 20, wherein the network designed as a low-pass structure is, however, realized dually thereto as a high-pass structure, for which purpose the inductance ΔLp=ΔLs is replaced by the series capacitance ΔCs, the bridge capacitance ΔCb is replaced by the bridge inductance ΔLm, and the ground capacitance ΔCm is replaced by the ground inductance ΔLm and the magnitudes of the series capacitance ΔCs, of the ground capacitance ΔCm, and of the ground inductance ΔLm are selected in accordance with the high-pass structure elements obtained by a dual transformation of the low-pass structure elements while applying the duality formation rules, and the values of the discrete components are selected such that the decoupling of the network connection gates is set at a sufficiently higher frequency f1 than the cut-off frequency fhp.

* * * * *